(12) United States Patent
Lee et al.

(10) Patent No.: US 10,852,897 B2
(45) Date of Patent: Dec. 1, 2020

(54) TOUCH PANEL AND TOUCH DISPLAY DEVICE

(71) Applicant: LG DISPLAY CO., LTD., Seoul (KR)

(72) Inventors: HwiDeuk Lee, Gyeongsangbuk-do (KR); DeukSu Lee, Gyeonggi-do (KR); JaeGyun Lee, Gyeonggi-do (KR); Yangsik Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/542,970

(22) Filed: Aug. 16, 2019

(65) Prior Publication Data

US 2020/0167038 A1   May 28, 2020

(30) Foreign Application Priority Data

Nov. 23, 2018   (KR) .................. 10-2018-0146390

(51) Int. Cl.
*G06F 3/041*  (2006.01)
*G06F 3/044*  (2006.01)
*H01L 27/32*  (2006.01)

(52) U.S. Cl.
CPC .......... *G06F 3/0445* (2019.05); *G06F 3/0446* (2019.05); *H01L 27/323* (2013.01)

(58) Field of Classification Search
None
See application file for complete search history.

(56) References Cited

U.S. PATENT DOCUMENTS

| | | | |
|---|---|---|---|
| 8,593,410 B2 | 11/2013 | Hong et al. | |
| 2010/0302201 A1 | 12/2010 | Ritter et al. | |
| 2011/0007020 A1 | 1/2011 | Hong et al. | |
| 2014/0111709 A1 | 4/2014 | Kim et al. | |
| 2015/0042598 A1* | 2/2015 | Chae | G06F 3/041 345/174 |
| 2016/0216838 A1 | 7/2016 | Aina et al. | |
| 2017/0308201 A1 | 10/2017 | Xie et al. | |
| 2018/0182818 A1 | 6/2018 | Kim | |
| 2018/0329537 A1 | 11/2018 | Gunji | |
| 2018/0329552 A1 | 11/2018 | Song et al. | |

FOREIGN PATENT DOCUMENTS

| | | |
|---|---|---|
| CN | 103365500 A | 10/2013 |
| CN | 105446522 A | 3/2016 |
| CN | 105807979 A | 7/2016 |
| CN | 108196736 A | 6/2018 |
| EP | 3291063 A1 | 3/2018 |
| EP | 3316102 A1 | 5/2018 |
| JP | 2016-109962 A | 7/2018 |
| TW | 201435459 A | 9/2014 |

\* cited by examiner

*Primary Examiner* — Carl Adams

(74) *Attorney, Agent, or Firm* — Birch, Stewart, Kolasch & Birch, LLP

(57) ABSTRACT

Embodiments of the present disclosure relate to a touch panel and a touch display panel, wherein touch electrodes including bodies and wings are arranged so as to interlock with each other to thus reduce a difference in sensing sensitivity depending on position and a movement direction, thereby improving uniformity of touch sensing. In addition, the body and wing of the touch electrode can be arranged so as to be varied in length/width depending on the position thereof, so that the boundary area between the touch electrodes is increased, thereby improving the intensity of a touch-sensing signal, and so that sensing time is reduced, thereby enhancing the performance of touch sensing.

16 Claims, 26 Drawing Sheets

FIG. 14
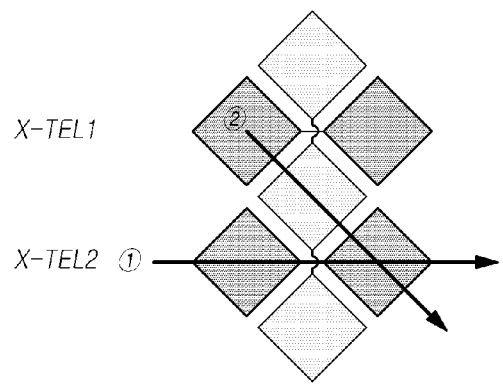
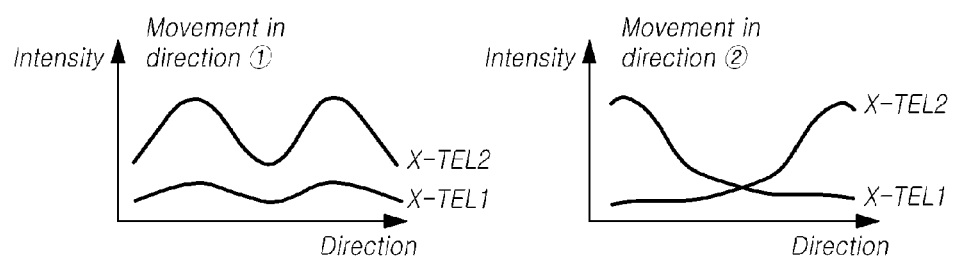
Graph for amount of change in intensity depending on direction in X-TELs Graph for amount of change in intensity depending on direction in X-TELs

TOUCH PANEL AND TOUCH DISPLAY DEVICE

CROSS REFERENCE TO RELATED APPLICATION

This application claims priority from Korean Patent Application No. 10-2018-0146390, filed on Nov. 23, 2018 in the Republic of Korea, which is hereby incorporated by reference for all purposes as if fully set forth herein.

BACKGROUND OF THE INVENTION

1. Field of the Invention

Embodiments of the present disclosure relate to a touch panel and a touch display device.

2. Description of the Background Art

The advent of the information society has brought growing demand for display devices for displaying images, and various types of display devices, such as a liquid crystal display device, an organic light-emitting display device, and the like, are being utilized.

In order to provide a variety of functions to users, display devices provide functions of recognizing a finger touch or a pen touch on the display panel and performing an input process on the basis of the recognized touch.

For example, a display device capable of recognizing a touch can include a plurality of touch electrodes arranged on or embedded in a display panel, and can drive the touch electrodes, thereby detecting whether or not a user's touch is performed on the display panel, the touch coordinates, and the like.

Accordingly, the display device can provide a variety of functions based on touch recognition. However, the display device exhibits uneven sensitivity of touch sensing depending on position on the display panel.

SUMMARY OF THE INVENTION

It is an aspect of the embodiments of the present disclosure to provide a touch panel and a touch display device including touch electrodes arranged thereon so as to have a structure in which sensitivity of touch sensing becomes uniform depending on the panel area where a finger or a pen is positioned.

It is another aspect of the embodiments of the present disclosure to provide a touch panel and a touch display device capable of reducing the difference in sensing sensitivity depending on the movement direction of a finger or a pen.

According to one aspect, the embodiments of the present disclosure can provide a touch display device including: a panel having a plurality of subpixels, a plurality of first touch electrodes, and a plurality of second touch electrodes arranged thereon; and a touch-driving circuit configured to drive the plurality of first touch electrodes and the plurality of second touch electrodes.

In such a touch display device, each of the plurality of first touch electrodes can include a first body arranged in a first direction and a plurality of first wings arranged in a second direction, intersecting the first direction, and connected to the first body, and each of the plurality of second touch electrodes can include a second body arranged in the first direction and a plurality of second wings arranged in the second direction and connected to the second body.

In addition, the first touch electrodes arranged adjacent to each other in the second direction, among the plurality of first touch electrodes, can be directly connected to each other by any one of the plurality of first wings, and the second touch electrodes arranged adjacent to each other in the first direction, among the plurality of second touch electrodes, can be electrically connected to each other by a plurality of first connection patterns arranged in a layer different from the second touch electrodes.

Further, the first body and the second body can be alternately arranged in the second direction, and the first wings and the second wings can be alternately arranged in the first direction.

According to another aspect, the embodiments of the present disclosure can provide a touch panel including: a plurality of first touch electrodes including a first body arranged in a first direction and a plurality of first wings arranged in a second direction, intersecting the first direction, and connected to the first body; a plurality of second touch electrodes including a second body arranged in the first direction and a plurality of second wings arranged in the second direction and connected to the second body; and a touch-driving circuit configured to drive the plurality of first touch electrodes and the plurality of second touch electrodes.

In such a touch panel, the first touch electrodes arranged adjacent to each other in the second direction, among the plurality of first touch electrodes, can be directly connected to each other by any one of the plurality of first wings, and the second touch electrodes arranged adjacent to each other in the first direction, among the plurality of second touch electrodes, can be electrically connected to each other by a plurality of first connection patterns arranged in a layer different from that of the second touch electrodes.

In addition, the first body and the second body can be alternately arranged in the second direction, and the first wings and the second wings can be alternately arranged in the first direction.

According to another aspect, the embodiments of the present disclosure can provide a touch panel including: a plurality of first touch electrodes including a first body arranged in a first direction and a plurality of first wings arranged in a second direction, intersecting the first direction and connected to the first body; a plurality of second touch electrodes including a second body arranged in the first direction and a plurality of second wings arranged in the second direction and connected to the second body; and a touch-driving circuit configured to drive the plurality of first touch electrodes and the plurality of second touch electrodes, wherein the first touch electrodes, which are arranged adjacent to each other in the second direction, among the plurality of first touch electrodes, are electrically connected to each other by a connection pattern arranged in a layer different from the first touch electrodes, wherein the second touch electrodes, which are arranged adjacent to each other in the first direction, among the plurality of second touch electrodes, are directly connected to each other by the second body, and wherein the first body and the second body are alternately arranged in the second direction, and the first wings and the second wings are alternately arranged in the first direction.

According to the embodiments of the present disclosure, a plurality of touch electrodes including bodies arranged in a first direction and wings arranged in a second direction intersecting the first direction can be arranged so as to interlock with each other, thereby reducing the difference in sensing sensitivity depending on the positions in the panel on which the touch electrodes are arranged and improving the uniformity of sensing performance.

In addition, it is possible to enhance the accuracy of pen-touch sensing with respect to the panel by making the sensing sensitivity, depending on the inclination or movement direction of the pen, uniform through the above-described touch electrode structure.

Further, by increasing the area where capacitance is produced between the touch electrodes through the above-described touch electrode structure, it is possible to improve the sensing sensitivity for a finger touch, thereby enhancing the accuracy of finger-touch sensing and shortening the sensing time.

BRIEF DESCRIPTION OF THE DRAWINGS

The above and other aspects, features, and advantages of the present disclosure will be more apparent from the following detailed description taken in conjunction with the accompanying drawings, in which:

FIG. 14 is a view illustrating an example of a difference in sensing performance depending on a movement direction in a touch display device according to embodiments of the present disclosure;

DETAILED DESCRIPTION OF THE EMBODIMENTS

Figure 1:
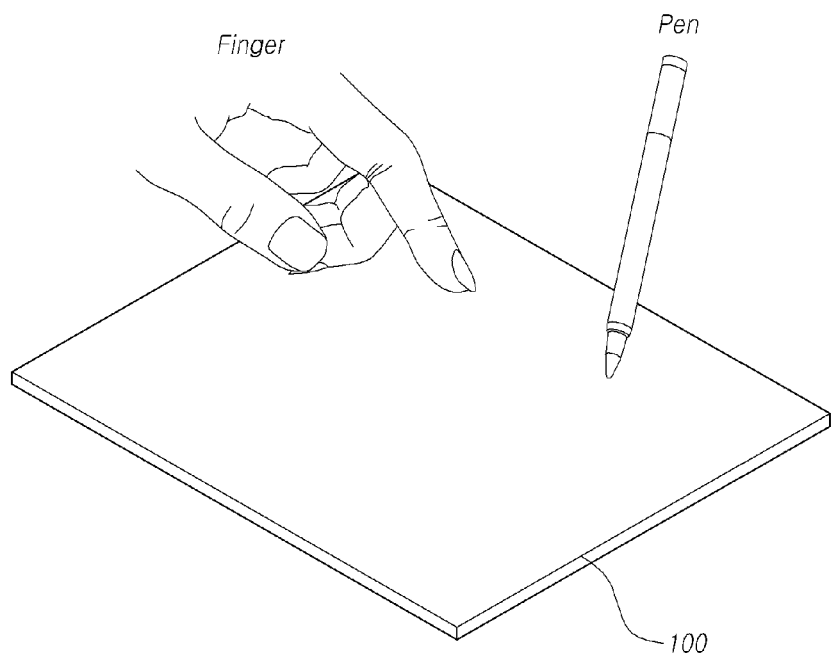
FIG. 1 is a view illustrating an example of a touch display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it can make the subject matter of the present disclosure rather unclear.

In addition, terms, such as first, second, A, B, (a), (b) or the like can be used herein when describing components of the present disclosure. These terms are merely used to distinguish one component from other components, and the property, order, sequence and the like of the corresponding component are not limited by the corresponding term. In the case that it is described that a certain structural element "is connected to", "is coupled to", or "is in contact with" another structural element, it should be interpreted that another structural element can "be connected to", "be coupled to", or "be in contact with" the structural elements as well as that the certain structural element is directly connected to or is in direct contact with another structural element.

FIG. 1 is a view illustrating an example of a touch display device 100 according to embodiments of the present disclosure.

Referring to FIG. 1, the touch display device 100 according to embodiments of the present disclosure can provide a function of sensing a touch by a finger, a pen, or the like, as well as a function of displaying images.

The "pen" can have a signal transmission/reception function, can interwork with the touch display device 100, or can be an active pen having its own power source, but the pen is not limited thereto.

The touch display device 100 according to embodiments of the present disclosure can be, for example, a television (TV), a monitor, or the like, or can be a mobile device such as a tablet PC, a smart phone, or the like.

The touch display device 100 according to embodiments of the present disclosure can include a display part for providing an image display function and a touch sensing part for providing a touch-sensing function.

Figure 2:
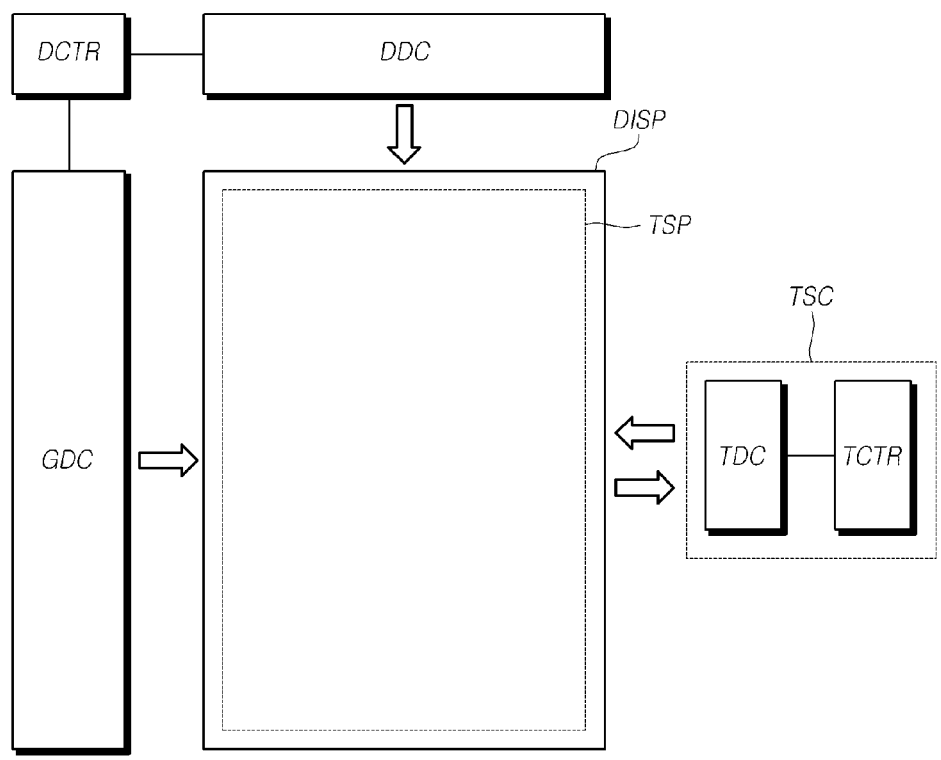
FIG. 2 is a view schematically illustrating the configuration of a touch display device according to embodiments of the present disclosure.

FIG. 2 is a view schematically illustrating the system configuration of a touch display device 100 according to embodiments of the present disclosure.

Referring to FIG. 2, a touch display device 100 according to embodiments of the present disclosure can provide both a function for displaying an image and a function for touch sensing.

In order to provide an image display function, the touch display device 100 according to embodiments of the present disclosure can include a display panel (DISP) on which a plurality of data lines and a plurality of gate lines are arranged and on which a plurality of subpixels defined by the plurality of data lines and the plurality of gate lines are arranged, a data-driving circuit (DDC) for driving the plurality of data lines, a gate-driving circuit (GDC) for driving the plurality of gate lines, and a display controller (DCTR) for controlling the operation of the data-driving circuit (DDC) and the gate-driving circuit (GDC).

Each of the data-driving circuit (DDC), the gate-driving circuit (GDC), and the display controller (DCTR) can be implemented as one or more discrete components. In some cases, two or more of the data-driving circuit (DDC), the gate-driving circuit (GDC), and the display controller (DCTR) can be integrated into a single component. For example, the data-driving circuit (DDC) and the display controller (DCTR) can be implemented as a single integrated circuit chip (IC Chip).

In order to provide a touch-sensing function, the touch display device 100 according to embodiments of the present disclosure can include a touch panel (TSP) including a plurality of touch electrodes and a touch-sensing circuit (TSC) for supplying a touch-driving signal to the touch panel (TSP), detecting a touch-sensing signal from the touch panel (TSP), and sensing whether or not a user's touch is performed on the touch panel (TSP) or a touch position (touch coordinates) thereof on the basis of the detected touch-sensing signal.

The touch-sensing circuit (TSC), for example, can include a touch-driving circuit (TDC) for supplying a touch-driving signal to the touch panel (TSP) and detecting a touch-sensing signal from the touch panel (TSP) and a touch controller (TCTR) for sensing whether or not a user's touch is performed on the touch panel (TSP) and/or a touch position thereof on the basis of the touch-sensing signal detected by the touch-driving circuit (TDC).

The touch-driving circuit (TDC) can include a first circuit part for supplying a touch-driving signal to the touch panel (TSP) and a second circuit part for detecting a touch-sensing signal from the touch panel (TSP).

The touch-driving circuit (TDC) and the touch controller (TCTR) can be implemented as separate components, or in some cases, can be integrated into a single component.

Each of the data-driving circuit (DDC), the gate-driving circuit (GDC), and the touch-driving circuit (TDC) can be implemented as one or more integrated circuits and, in terms of electrical connection with the display panel (DISP), can be implemented as a chip-on-glass (COG) type, a chip-on-film (COF) type, a tape carrier package (TCP) type, and the like. The gate-driving circuit (GDC) can also be implemented as a gate-in-panel (GIP) type.

The respective circuit configurations (DDC, GDC, and DCTR) for display driving and the respective circuit configurations (TDC and TCTR) for touch sensing can be implemented as one or more discrete components. In some cases, one or more of the circuit configurations (DDC, GDC, and DCTR) for display driving and one or more of the circuit configurations (TDC and TCTR) for touch sensing can be functionally integrated into one or more components.

For example, the data-driving circuit (DDC) and the touch-driving circuit (TDC) can be integrated into one or more integrated circuit chips. In the case where the data-driving circuit (DDC) and the touch-driving circuit (TDC) are integrated into two or more integrated circuit chips, the two or more integrated circuit chips can have a data driving function and a touch driving function, respectively.

The touch display device 100 according to embodiments of the present disclosure can be any of various types of display devices such as an organic light-emitting display device, a liquid crystal display device, or the like. Hereinafter, for the convenience of explanation, a description will be made on the basis of an example in which the touch display device 100 is an organic light-emitting display device. That is, although the display panel (DISP) can be any of various types of display panels, such as an organic light-emitting display panel, a liquid crystal display panel, or the like, the following description will be made on the basis of an example in which the display panel (DISP) is an organic light-emitting display panel for the convenience of explanation.

As will be described later, the touch panel (TSP) can include a plurality of touch electrodes, to which a touch-driving signal is applied or from which a touch-sensing signal is detected, and a plurality of touch-routing lines for connecting the plurality of touch electrodes to the touch-driving circuit (TDC).

The touch panel (TSP) can be provided outside the display panel (DISP). That is, the touch panel (TSP) and the display panel (DISP) can be separately manufactured and combined with each other. Such a touch panel (TSP) is referred to as an "external type" or "add-on type" touch panel.

Alternatively, the touch panel (TSP) can be embedded in the display panel (DISP). That is, a touch sensor structure, such as a plurality of touch electrodes, a plurality of touch-routing lines, and the like, constituting the touch panel (TSP) can be formed together with electrodes and signal lines for driving the display when manufacturing the display panel (DISP). Such a touch panel (TSP) is called an "embedded-type touch panel". Hereinafter, for the convenience of explanation, the embedded-type touch panel (TSP) will be described by way of example.

Figure 3:
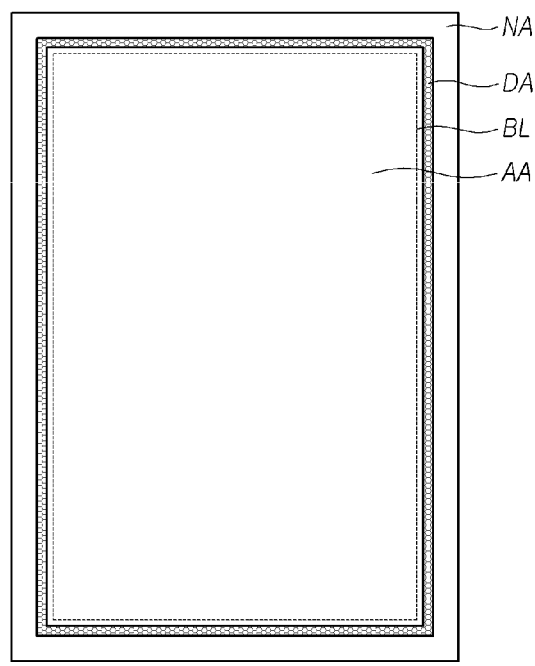
FIG. 3 is a view schematically illustrating a display panel of a touch display device according to embodiments of the present disclosure.

FIG. 3 is a view schematically illustrating a display panel (DISP) of a touch display device 100 according to embodiments of the present disclosure.

Referring to FIG. 3, the display panel (DISP) can include an active area (AA) in which an image is displayed and a non-active area (NA), which is an outer area of an outer boundary line (BL) of the active area (AA).

In the active area (AA) of the display panel (DISP), a plurality of subpixels for displaying images is arranged, and various electrodes and signal lines for driving the display are arranged.

In addition, a plurality of touch electrodes for touch sensing and a plurality of touch-routing lines electrically connected to the touch electrodes can be arranged in the active area (AA) of the display panel (DISP). Accordingly, the active area (AA) can be referred to as a "touch-sensing area" in which a touch is able to be sensed.

In the non-active area (NA) of the display panel (DISP), link lines, which are extensions of various signal lines arranged in the active area (AA), or link lines electrically connected to various signal lines arranged in the active area (AA) and pads electrically connected to the link lines, can be arranged. The pads arranged in the non-active area (NA) can be bonded or electrically connected to the display-driving circuits (DDC, GDC, or the like).

In addition, in the non-active area (NA) of the display panel (DISP), link lines, which are extensions of a plurality of touch-routing lines arranged in the active area (AA), or link lines electrically connected to the plurality of touch-routing lines arranged in the active area (AA) and pads electrically connected to the link lines, can be arranged. The pads arranged in the non-active area (NA) can be bonded or electrically connected to the touch-driving circuit (TDC).

An extended portion of a part of the outermost touch electrode, among the plurality of touch electrodes arranged in the active area (AA), can be in the non-active area (NA), and one or more electrodes (touch electrodes) of the same material as the plurality of touch electrodes arranged in the active area (AA) can be further arranged in the non-active area (NA).

That is, all of the plurality of touch electrodes arranged in the display panel (DISP) can be provided in the active area (AA); some (e.g., the outermost touch electrodes) of the plurality of touch electrodes arranged in the display panel (DISP) can be provided in the non-active area (NA); or some (e.g., the outermost touch electrodes) of the plurality of touch electrodes arranged in the display panel (DISP) can be provided in both the active area (AA) and the non-active area (NA).

Referring to FIG. 3, the display panel (DISP) of a touch display device according to embodiments of the present disclosure can include a dam area (DA) where dams for preventing the collapse of a specific layer (e.g., an encapsulation portion in an organic light-emitting display panel) in the active area (AA) are arranged.

The dam area (DA) can be positioned at the boundary between the active area (AA) and the non-active area (NA) or at any place in the non-active area (NA) outside the active area (AA).

The dam can be arranged in the dam area (DA) so as to surround the active area (AA) in all directions, or can be arranged only in the outside of one or more portions (e.g., a portion having a vulnerable layer) of the active area (AA).

The dam arranged in the dam area (DA) can have a single pattern that is continuous as a whole, or can have two or more discontinuous patterns. Further, only a primary dam can be arranged in the dam area (DA), or two dams (a primary dam and a secondary dam) or three or more dams can be arranged in the dam area (DA).

In the dam area (DATA), only a primary dam can be arranged in one direction, and both a primary dam and a secondary dam can be arranged in another direction.

Figure 4:
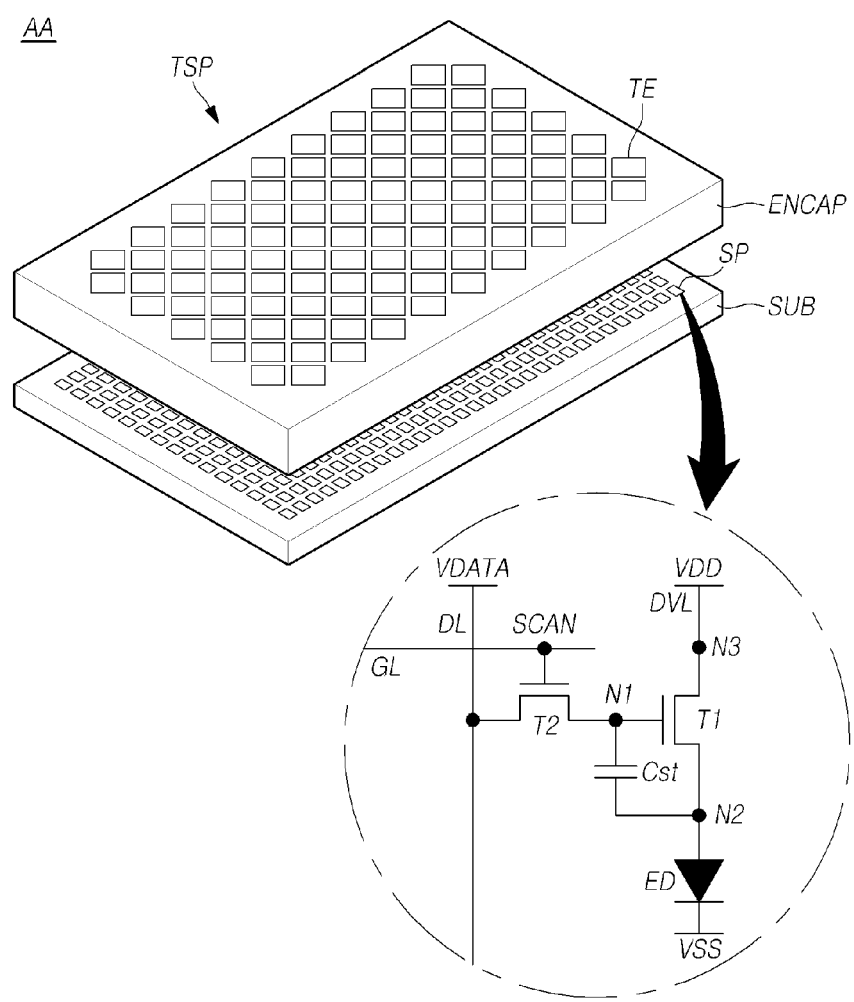
FIG. 4 is a view illustrating an example of a structure in which a touch panel is embedded in a display panel according to embodiments of the present disclosure.

FIG. 4 is a view illustrating an example of a structure in which a touch panel (TSP) is embedded in a display panel (DISP) according to embodiments of the present disclosure.

Referring to FIG. 4, a plurality of subpixels (SP) is arranged on a substrate (SUB) in the active area (AA) of the display panel (DISP).

Each subpixel (SP) can include a light-emitting device (ED), a first transistor (T1) for driving the light-emitting device (ED), a second transistor (T2) for transmitting a data voltage (VDATA) to a first node (N1) of the first transistor (T1), and a storage capacitor (Cst) for maintaining a constant voltage for one frame.

The first transistor (T1) can include a first node (N1) to which a data voltage (VDATA) can be applied, a second node (N2) electrically connected to the light-emitting device (ED), and a third node (N3) to which a driving voltage (VDD) is applied from a driving voltage line (DVL). The first node (N1) can be a gate node; the second node (N2) can be a source node or a drain node; and the third node (N3) can be a drain node or a source node. The first transistor (T1) is also referred to as a "driving transistor" for driving the light-emitting device (ED).

The light-emitting device (ED) can include a first electrode (e.g., an anode electrode), a light-emitting layer, and a second electrode (e.g., a cathode electrode). The first electrode can be electrically connected to the second node (N2) of the first transistor (T1), and the second electrode can have a base voltage (VSS) applied thereto.

The light-emitting layer of the light-emitting device (ED) can be an organic light-emitting layer containing an organic material. In this case, the light-emitting device (ED) can be an organic light-emitting diode (OLED).

The second transistor (T2) can be controlled to be turned on and off by a scan signal (SCAN) applied through a gate line (GL), and can be electrically connected to the first node (N1) of the first transistor (T1) and the data line (DL). The second transistor (T2) is also referred to as a "switching transistor".

If the second transistor (T2) is turned on by the scan signal (SCAN), a data voltage (VDATA) supplied from the data line (DL) is transferred to the first node (N1) of the first transistor (T1).

The storage capacitor (Cst) can be electrically connected to the first node (N1) and the second node (N2) of the first transistor (T1).

Each subpixel (SP), as shown in FIG. 4, can have a 2T1C structure including two transistors (T1 and T2) and one capacitor (Cst), and can further include one or more transistors, or can further include one or more capacitors in some cases.

The storage capacitor (Cst) can be an external capacitor that is intentionally designed so as to be provided outside the first transistor (T1), instead of a parasitic capacitor (e.g., Cgs or Cgd), which is an internal capacitor to be provided between the first node (N) and the second node (N2) of the first transistor (T1).

Each of the first transistor (T1) and the second transistor (T2) can be an n-type transistor or a p-type transistor.

As described above, circuit devices, such as a light-emitting device (ED), two or more transistors (T1 and T2), and one or more capacitors (Cst), are arranged in the display panel (DISP). Since the circuit devices (in particular, the light-emitting device ED) are vulnerable to external moisture or oxygen, an encapsulation portion (ENCAP) for preventing the penetration of external moisture or oxygen into the circuit devices (in particular, the light-emitting device ED) can be arranged in the display panel (DISP).

The encapsulation portion (ENCAP) can be formed as a single layer or multiple layers.

The touch panel (TSP) can be formed on the encapsulation portion (ENCAP) in the touch display device 100 according to embodiments of the present disclosure.

That is, a touch sensor structure, such as a plurality of touch electrodes (TE) constituting the touch panel (TSP), can be arranged on the encapsulation portion (ENCAP) in the touch display device 100.

When sensing a touch, a touch-driving signal or a touch-sensing signal can be applied to the touch electrodes (TE). Therefore, when sensing a touch, a potential difference can be produced between the touch electrode (TE) and the cathode electrode arranged with the encapsulation portion (ENCAP) interposed therebetween, thereby creating undesired parasitic capacitance. In order to reduce the parasitic capacitance, which can degrade touch sensitivity, the distance between the touch electrode (TE) and the cathode electrode can be designed to be equal to or greater than a predetermined value (e.g., 1 μm) in consideration of the panel thickness, panel-manufacturing processes, display performance, and the like. To this end, the thickness of the encapsulation portion (ENCAP), for example, can be designed to be at least 1 μm or more.

Figure 5:
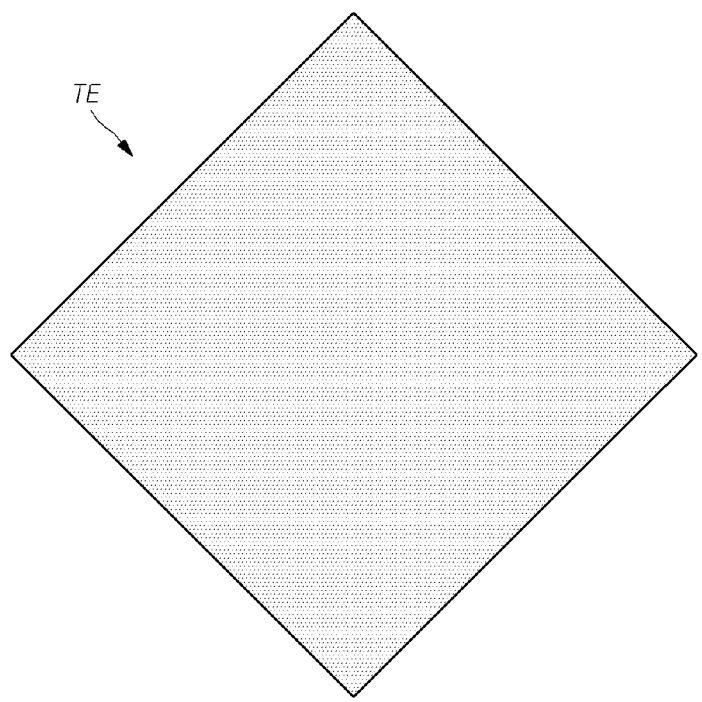
FIGS. 5 and 6 are views illustrating examples of the types of touch electrodes arranged in a display panel according to embodiments of the present disclosure.
Figure 6:
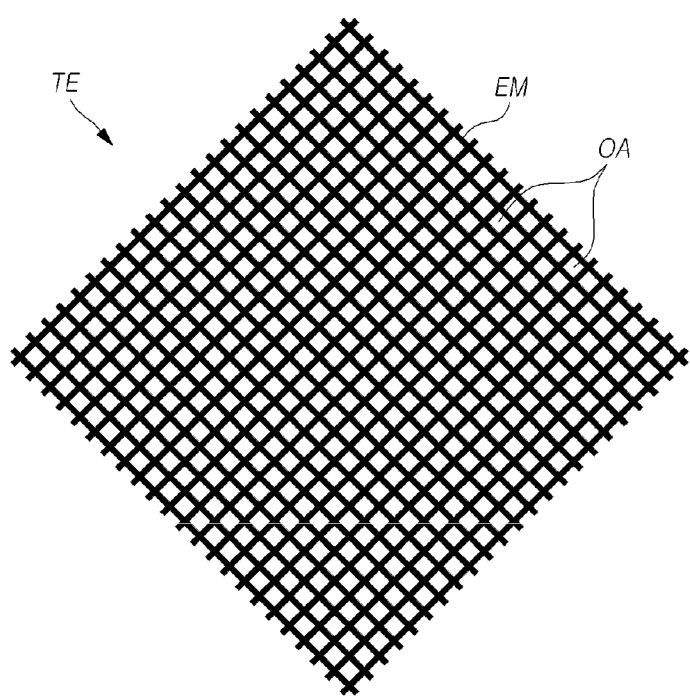

FIGS. 5 and 6 are views illustrating examples of the types of touch electrodes (TE) arranged in a display panel (DISP) according to embodiments of the present disclosure.

As shown in FIG. 5, each touch electrode (TE) arranged in the display panel (DISP) can be a plate-type electrode metal having no openings therein. In this case, each touch electrode (TE) can be a transparent electrode. That is, each touch electrode (TE) can be made of a transparent electrode material so that light emitted from a plurality of subpixels (SP) arranged thereunder can pass upwards through the touch electrode (TE).

Alternatively, as shown in FIG. 6, each touch electrode (TE) arranged in the display panel (DISP) can be an electrode metal (EM) patterned in the form of a mesh so as to have two or more openings (OA) therein.

The electrode metal (EM) corresponds to a substantial touch electrode (TE) where a touch-driving signal is applied or a touch-sensing signal is detected.

As shown in FIG. 6, in the case where each touch electrode (TE) is an electrode metal (EM) patterned in the form of a mesh, two or more openings (OA) can be provided in the area of the touch electrode (TE).

Each of the two or more openings (OA) provided in each touch electrode (TE) can correspond to the light-emitting area of one or more subpixels (SP). That is, a plurality of openings (OA) provides paths through which light emitted from a plurality of subpixels (SP) arranged thereunder passes. For example, each of the plurality of touch electrodes (TE) is a mesh type including an open area (or opening (OA)), and the open area positionally corresponds to a light emitting region of the subpixels (SP). Hereinafter, a description will be made of an example in which each touch electrode (TE) is a mesh-type electrode metal (EM) for the convenience of explanation.

The electrode metal (EM) corresponding to each touch electrode (TE) can be positioned on a bank that is arranged in the area other than the light-emitting area of two or more subpixels (SP).

As a method of forming a plurality of touch electrodes (TE), the electrode metal (EM) can be formed to be wide in the form of a mesh, and then the electrode metal (EM) can be cut into a predetermined pattern to electrically isolate the electrode metal (EM), thereby providing a plurality of touch electrodes (TE).

The outline of the touch electrode (TE) can have a square shape, such as a diamond shape or a rhombus, as shown in FIGS. 5 and 6, or can have any of various shapes such as those of a triangle, a pentagon, or a hexagon. In embodiments, the touch electrode (TE) each can have a "T" shape or portions of the "T" shape.

Figure 7:
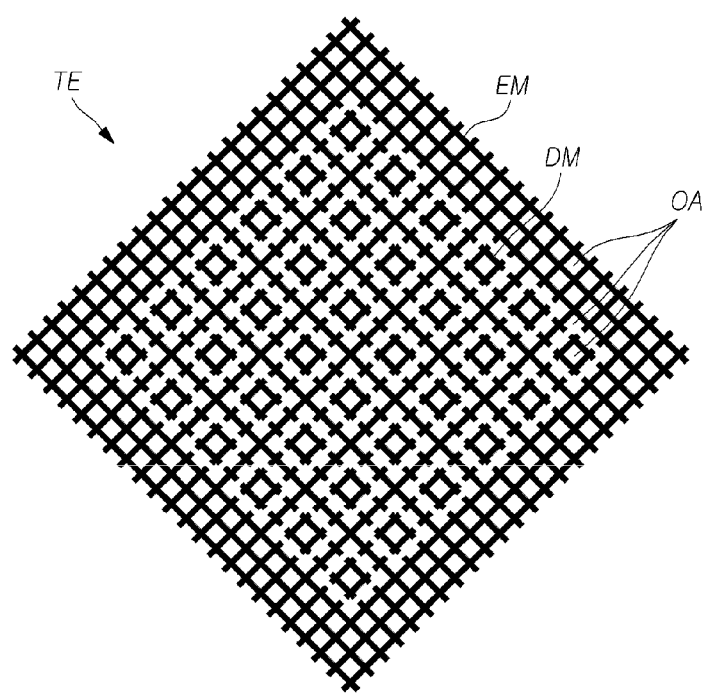
FIG. 7 is a view illustrating an example of the mesh-type touch electrode shown in FIG. 6.

FIG. 7 is a view illustrating an example of the mesh-type touch electrode (TE) shown in FIG. 6.

Referring to FIG. 7, the area of each touch electrode (TE) can be provided with one or more dummy metals (DM) that are separate from the mesh-type electrode metal (EM).

The electrode metal (EM) corresponds to a substantial touch electrode (TE) where a touch-driving signal is applied or a touch-sensing signal is detected. However, although the dummy metal (DM) is provided in the area of the touch electrode (TE), a touch-driving signal is not applied thereto and a touch-sensing signal is not detected therefrom. That is, the dummy metal (DM) can be an electrically floating metal.

Therefore, the electrode metal (EM) can be electrically connected to the touch-driving circuit (TDC), whereas the dummy metal (DM) need not be electrically connected to the touch-driving circuit (TDC).

One or more dummy metals (DM) can be provided in the areas of the respective touch electrodes (TE) in the state of being disconnected from the electrode metal (EM).

Alternatively, one or more dummy metals (DM) can be provided only in the areas of some of all the touch electrodes (TE) in the state of being disconnected from the electrode metal (EM). That is, the dummy metal (DM) need not be provided in the areas of some touch electrodes (TE).

With regard to the role of the dummy metal (DM), in the case where no dummy metal (DM) is provided and only the mesh-type electrode metal (EM) is provided in the area of the touch electrode (TE) as shown in FIG. 6, there can be a visible defect in which the outline of the electrode metal (EM) can be visible on the screen.

On the other hand, in the case where one or more dummy metals (DM) are provided in the area of the touch electrode (TE) as shown in FIG. 7, it is possible to remove the visible defect in which the outline of the electrode metal (EM) can be visible on the screen.

In addition, the magnitude of the capacitance of each touch electrode (TE) can be adjusted by providing or not providing the dummy metals (DM) or by adjusting the number of dummy metals (DM) (the ratio of dummy metals) for each touch electrode (TE), thereby enhancing the touch sensitivity.

Some points of the electrode metal (EM) formed in the area of one touch electrode (TE) can be cut away so that the cut electrode metal (EM) becomes the dummy metal (DM). That is, the electrode metal (EM) and the dummy metal (DM) can be formed of the same material in the same layer.

The touch display device 100 according to embodiments of the present disclosure can sense a touch on the basis of the capacitance produced in the touch electrode (TE).

The touch display device 100 according to embodiments of the present disclosure is able to sense a touch by a capacitance-based touch sensing method such as a mutual-capacitance-based touch sensing method or a self-capacitance-based touch sensing method.

In the case of the mutual-capacitance-based touch sensing method, a plurality of touch electrodes (TE) can be divided into driving touch electrodes (transmitting touch electrodes or TX touch electrodes), to which a touch-driving signal is applied, and sensing touch electrodes (receiving touch electrodes or RX touch electrodes), in which a touch-sensing signal is detected and which form capacitance together with the driving touch electrodes.

In the case of the mutual-capacitance-based touch sensing method, a touch-sensing circuit (TSC) senses whether or not a touch is performed and/or touch coordinates on the basis of a change in the capacitance (mutual-capacitance) between the driving touch electrode and the sensing touch electrode depending on whether or not there is a pointer such as a finger or a pen.

In the case of the self-capacitance-based touch sensing method, each touch electrode (TE) serves both as the driving touch electrode and as the sensing touch electrode. That is, the touch-sensing circuit (TSC) applies a touch-driving signal to one or more touch electrodes (TE), detects a touch-sensing signal through the touch electrodes (TE) to which the touch-driving signal is applied, and recognizes a change in the capacitance between a pointer, such as a finger or a pen, and the touch electrode (TE) on the basis of the detected touch-sensing signal, thereby sensing whether or not a touch is performed and/or the touch coordinates. The self-capacitance-based touch-sensing method does not distinguish between the driving touch electrode and the sensing touch electrode.

As described above, the touch display device 100 according to embodiments of the present disclosure can sense a touch by a mutual-capacitance-based touch sensing method or by a self-capacitance-based touch sensing method. Hereinafter, for the convenience of explanation, a description will be made of an example in which the touch display device 100 performs mutual-capacitance-based touch sensing and has a touch sensor structure for the same.

Figure 8:
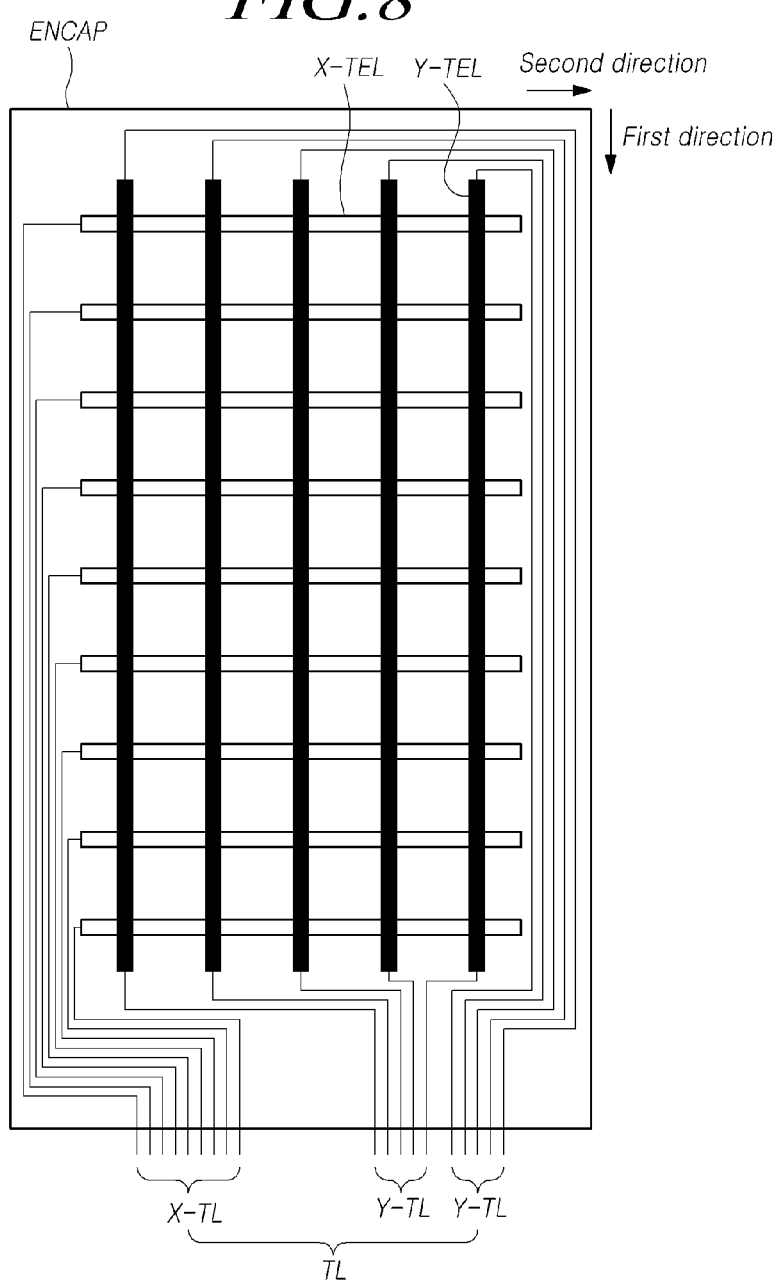
FIG. 8 is a view schematically illustrating a touch sensor structure in a display panel according to embodiments of the present disclosure.
Figure 9:
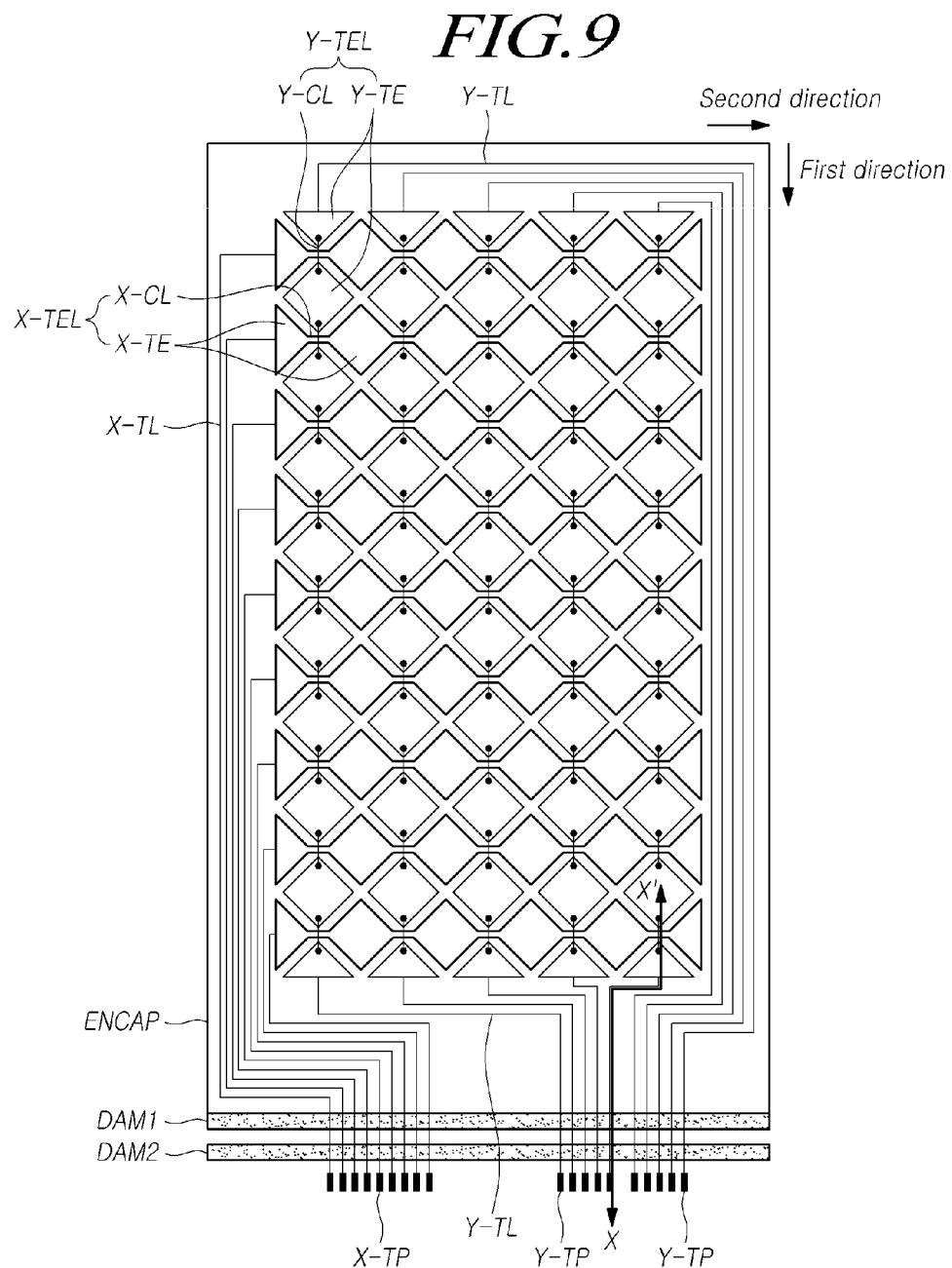
FIG. 9 is a view illustrating an example of implementing the touch sensor structure shown in FIG. 8.

FIG. 8 is a view schematically illustrating a touch sensor structure in a display panel (DISP) according to embodiments of the present disclosure, and FIG. 9 is a view illustrating an example of implementing the touch sensor structure in FIG. 8.

Referring to FIG. 8, a touch sensor structure for mutual-capacitance-based touch sensing can include a plurality of X-touch electrode lines (X-TEL) and a plurality of Y-touch electrode lines (Y-TEL). The plurality of X-touch electrode lines (X-TEL) and the plurality of Y-touch electrode lines (Y-TEL) are positioned on the encapsulation portion (ENCAP).

The respective X-touch electrode lines (X-TEL) can be arranged in a second direction, and the respective Y-touch electrode lines (Y-TEL) can be arranged in a first direction different from the second direction.

In the present specification, the first direction and the second direction can be different from each other, and for example, the first direction can be the y-axis direction and the second direction can be the x-axis direction. On the other hand, the first direction can be the x-axis direction and the second direction can be the y-axis direction. In addition, the first direction and the second direction can or need not be orthogonal to each other. In the present specification, rows and columns are relative, and can be interchanged with each other depending on the point of view.

Each of the plurality of X-touch electrode lines (X-TEL) can include a plurality of X-touch electrodes (X-TE) electrically connected to each other. Each of the plurality of Y-touch electrode lines (Y-TEL) can include a plurality of Y-touch electrodes (Y-TE) electrically connected to each other.

The plurality of X-touch electrodes (X-TE) and the plurality of Y-touch electrodes (Y-TE) belong to a plurality of touch electrodes (TE), and have different roles (functions) from each other.

For example, a plurality of X-touch electrodes (X-TE) constituting each of the plurality of X-touch electrode lines (X-TEL) can be driving touch electrodes, and a plurality of Y-touch electrodes (Y-TE) constituting each of the plurality of Y-touch electrode lines (Y-TEL) can be sensing touch electrodes. In this case, the respective X-touch electrode lines (X-TEL) correspond to driving touch electrode lines, and the respective Y-touch electrode lines (Y-TEL) correspond to sensing touch electrode lines.

On the other hand, a plurality of X-touch electrodes (X-TE) constituting each of the plurality of X-touch electrode lines (X-TEL) can be sensing touch electrodes, and a plurality of Y-touch electrodes (Y-TE) constituting each of the plurality of Y-touch electrode lines (Y-TEL) can be driving touch electrodes. In this case, the respective X-touch electrode lines (X-TEL) correspond to sensing touch electrode lines, and the respective Y-touch electrode lines (Y-TEL) correspond to driving touch electrode lines.

The touch sensor metal for touch sensing can include a plurality of touch-routing lines (TL), as well as the plurality of X-touch electrode lines (X-TEL) and the plurality of Y-touch electrode lines (Y-TEL).

The plurality of touch-routing lines (TL) can include one or more X-touch-routing lines (X-TL) connected to the respective X-touch electrode lines (X-TEL) and one or more Y-touch-routing lines (Y-TL) connected to the respective Y-touch electrode lines (Y-TEL).

Referring to FIG. 9, each of the plurality of X-touch electrode lines (X-TEL) can include a plurality of X-touch electrodes (X-TE) arranged in the same row (or column) and one or more X-touch-electrode-connecting lines (X-CL) for electrically connecting the same to each other. The X-touch-electrode-connecting line (X-CL) for connecting two adjacent X-touch electrodes (X-TE) can be a metal that is integral with two adjacent X-touch electrodes (X-TE) (see FIG. 9), or can be a metal connected with two adjacent X-touch electrodes (X-TE) through contact holes.

Each of the plurality of Y-touch electrode lines (Y-TEL) can include a plurality of Y-touch electrodes (Y-TE) arranged in the same column (or row) and one or more Y-touch-electrode-connecting lines (Y-CL) for electrically connecting the same to each other. The Y-touch-electrode-connecting line (Y-CL) for connecting two adjacent Y-touch electrodes (Y-TE) can be a metal that is integral with two adjacent Y-touch electrodes (Y-TE), or can be a metal connected to two adjacent Y-touch electrodes (Y-TE) through contact holes (see FIG. 9).

The metal connected to two adjacent X-touch electrodes (X-TE) or to two adjacent Y-touch electrodes (Y-TE) through the contact holes can be referred to as a "connection pattern".

The X-touch-electrode-connecting line (X-CL) and the Y-touch-electrode-connecting line (Y-CL) can intersect each other in the area where the X-touch electrode line (X-TEL) and the Y-touch electrode line (Y-TEL) intersect each other (a touch-electrode-line intersection area).

In the case where the X-touch-electrode-connecting line (X-CL) and the Y-touch-electrode-connecting line (Y-CL) intersect in the touch-electrode-line intersection area as described above, the X-touch-electrode-connecting line (X-CL) and the Y-touch-electrode-connecting line (Y-CL) must be positioned in different layers from each other.

Accordingly, in order to achieve an arrangement such that the plurality of X-touch electrode lines (X-TEL) and the plurality of Y-touch electrode lines (Y-TEL) intersect each other, the plurality of X-touch electrodes (X-TE), the plurality of X-touch-electrode-connecting lines (X-CL), the plurality of Y-touch electrodes (Y-TE), the plurality of Y-touch electrode lines (Y-TEL), and the plurality of Y-touch-electrode-connecting lines (Y-CL) can be provided in two or more layers.

Referring to FIG. 9, the respective X-touch electrode lines (X-TEL) are electrically connected to corresponding X-touch pads (X-TP) via one or more X-touch-routing lines (X-TL). That is, the outermost X-touch electrode (X-TE), among the plurality of X-touch electrodes (X-TE) included in one X-touch electrode line (X-TEL), is electrically connected to the corresponding X-touch pad (X-TP) via the X-touch-routing line (X-TL).

The respective Y-touch electrode lines (Y-TEL) are electrically connected to corresponding Y-touch pads (Y-TP) via one or more Y-touch-routing lines (Y-TL). That is, the outermost Y-touch electrode (Y-TE), among the plurality of Y-touch electrodes (Y-TE) included in one Y-touch electrode line (Y-TEL), is electrically connected to the corresponding Y-touch pad (Y-TP) via the Y-touch-routing line (Y-TL).

As shown in FIG. 9, the plurality of X-touch electrode lines (X-TEL) and the plurality of Y-touch electrode lines (Y-TEL) can be arranged on the encapsulation portion (ENCAP). That is, the plurality of X-touch electrodes (X-TE) and the plurality of X-touch-electrode-connecting lines (X-CL) constituting the plurality of X-touch electrode lines (X-TEL) can be arranged on the encapsulation portion (ENCAP). In addition, the plurality of Y-touch electrodes (Y-TE) and the plurality of Y-touch-electrode-connecting lines (Y-CL) constituting the plurality of Y-touch electrode lines (Y-TEL) can be arranged on the encapsulation portion (ENCAP).

As shown in FIG. 9, the respective X-touch-routing lines (X-TL) electrically connected to the plurality of X-touch electrode lines (X-TEL) can be arranged on the encapsulation portion (ENCAP) so as to extend to the area where the encapsulation portion (ENCAP) is not provided, and can be electrically connected to a plurality of X-touch pads (X-TP). In addition, the respective Y-touch-routing lines (Y-TL) electrically connected to the plurality of Y-touch electrode lines (Y-TEL) can be arranged on the encapsulation portion (ENCAP) so as to extend to the area where the encapsulation portion (ENCAP) is not provided, and can be electrically connected to a plurality of Y-touch pads (Y-TP). The encapsulation portion (ENCAP) can be provided in the active area (AA), and in some cases can extend to the non-active area (NA).

As described above, a dam area (DA) can be provided in the boundary area between the active area (AA) and the non-active area (NA) or in the non-active area (NA) outside the active area (AA) in order to prevent any layer (e.g., an encapsulation portion in the organic light-emitting display panel) in the active area (AA) from collapsing.

As shown in FIG. 9, for example, a primary dam (DAM1) and a secondary dam (DAM2) can be arranged in the dam area (DA). The secondary dam (DAM2) can be positioned outside the primary dam (DAM1).

As alternatives to the example in FIG. 9, only the primary dam (DAM1) can be provided in the dam area (DA), and in some cases, one or more additional dams can be further arranged in the dam area (DA), as well as the primary dam (DAM1) and the secondary dam (DAM2).

Referring to FIG. 9, the encapsulation portion (ENCAP) can be positioned on the side of the primary dam (DAM1), or the encapsulation portion (ENCAP) can be positioned on the top of the primary dam (DAM1), as well as on the side thereof.

Figure 10:
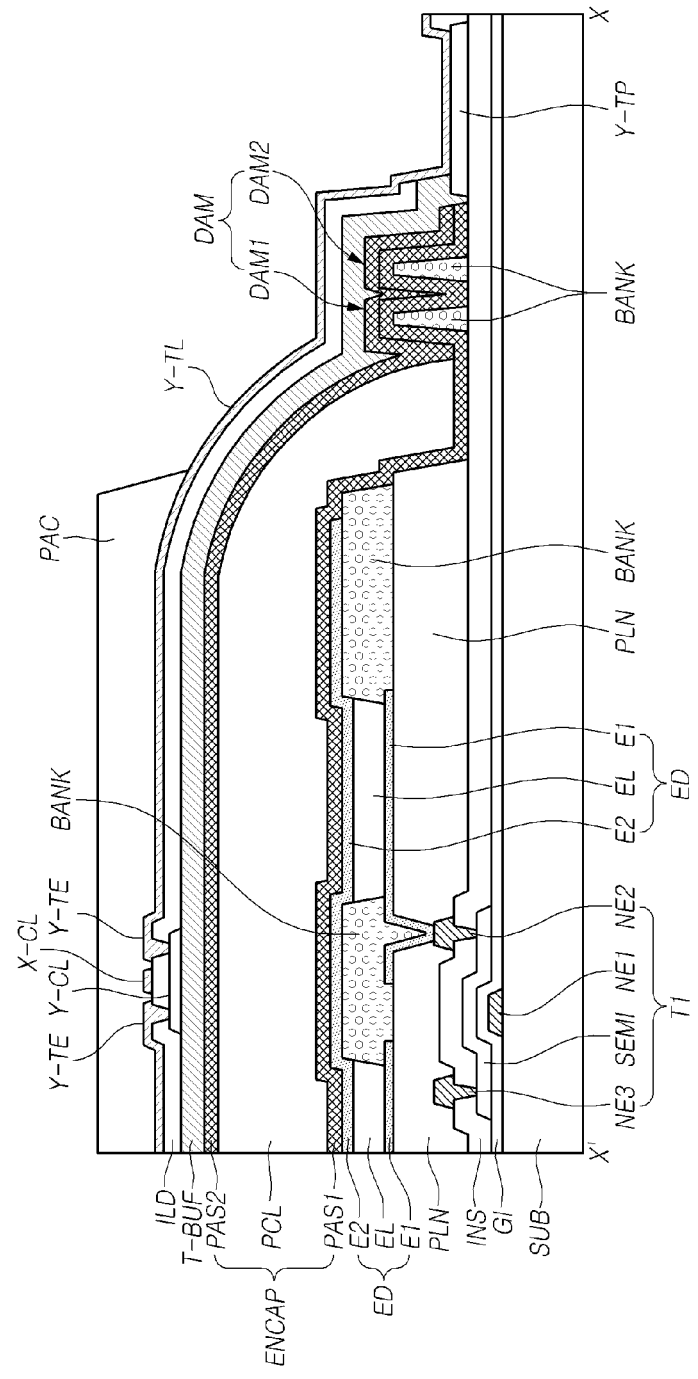
FIG. 10 is a cross-sectional view of a part of a display panel taken along the line X-X' in FIG. 9 according to embodiments of the present disclosure.

FIG. 10 is a cross-sectional view of a part of a display panel (DISP) taken along the line X-X' in FIG. 9 according to embodiments of the present disclosure. Although a plate-type touch electrode (TE) is illustrated in FIG. 10, this is merely an example, and a mesh-type touch electrode can be provided.

A first transistor (T1), which is a driving transistor in each subpixel (SP) in the active area (AA), is arranged on a substrate (SUB).

The first transistor (T1) includes a first node electrode (NE1) serving as a gate electrode, a second node electrode (NE2) serving as a source electrode or a drain electrode, a third node electrode (NE3) serving as a drain electrode or a source electrode, a semiconductor layer (SEMI), and the like.

The first node electrode (NE1) and the semiconductor layer (SEMI) can overlap each other with a gate insulating film (GI) interposed therebetween. The second node electrode (NE2) can be formed on an insulating layer (INS) so as to come into contact with one end of the semiconductor layer (SEMI), and the third node electrode (NE3) can be formed on the insulating layer (INS) so as to come into contact with the opposite end of the semiconductor layer (SEMI).

A light-emitting device (ED) can include a first electrode (E1) serving as an anode electrode (or a cathode electrode), a light-emitting layer (EL) formed on the first electrode (E1), and a second electrode (E2), which serves as a cathode electrode (or an anode electrode), formed on the light-emitting layer (EL).

The first electrode (E1) is electrically connected to the second node electrode (NE2) of the first transistor (T1), which is exposed through a pixel contact hole passing through a planarization layer (PLN).

The light-emitting layer (EL) is formed on the first electrode (E1) in the light-emitting area provided by a bank (BANK). The light-emitting layer (EL) is formed by stacking layers in the order of a hole-related layer, a light-emitting layer, and an electron-related layer, or in the reverse order thereof, on the first electrode (E1). The second electrode (E2) is formed to face the first electrode (E1) with the light-emitting layer (EL) interposed therebetween.

The encapsulation portion (ENCAP) prevents external moisture or oxygen from penetrating into the light-emitting device (ED), which is vulnerable to external moisture or oxygen.

The encapsulation portion (ENCAP) can be configured as a single layer, or can be configured as multiple layers (PAS1, PCL, and PAS2) as shown in FIG. 10.

For example, in the case where the encapsulation portion (ENCAP) is configured as multiple layers (PAS1, PCL, and PAS2), the encapsulation portion (ENCAP) can include one or more inorganic encapsulation layers (PAS1 and PAS2) and one or more organic encapsulation layers (PCL). More specifically, the encapsulation portion (ENCAP) can have a structure in which a first inorganic encapsulation layer (PAS1), an organic encapsulation layer (PCL), and a second inorganic encapsulation layer (PAS2) are sequentially stacked.

The organic encapsulation layer (PCL) can further include at least one organic encapsulation layer or at least one inorganic encapsulation layer.

The first inorganic encapsulation layer (PAS1) is formed on the substrate (SUB), on which the second electrode (E2) serving as a cathode electrode is formed, so as to be closest to the light-emitting device (ED). The first inorganic encapsulation layer (PAS1) is formed of an inorganic insulating material that enables low-temperature deposition, such as silicon nitride (SiNx), silicon oxide (SiOx), silicon oxynitride (SiON), aluminum oxide (Al2O3), or the like. Since the first inorganic encapsulation layer (PAS1) is deposited in a low-temperature atmosphere, the first inorganic encapsulation layer (PAS1) is able to prevent the light-emitting layer (EL), which has an organic material vulnerable to a high-temperature atmosphere, from being damaged during the deposition process.

The organic encapsulation layer (PCL) can be formed so as to have an area smaller than that of the first inorganic encapsulation layer (PAS1). In this case, the organic encapsulation layer (PCL) can be formed to expose both ends of the first inorganic encapsulation layer (PAS1). The organic encapsulation layer (PCL) can serve as a buffer for relieving the stress between the respective layers due to warping of the touch display device, which is an organic light-emitting display device, and can strengthen planarization performance. The organic encapsulation layer (PCL) can be formed of an organic insulating material such as an acrylic resin, an epoxy resin, polyimide, polyethylene, silicon oxycarbide (SiOC), or the like.

In the case where the organic encapsulation layer (PCL) is formed by an inkjet method, one or more dams (DAM) can be formed in the dam area (DA) corresponding to the boundary area between the non-active area (NA) and the active area (AA) or corresponding to some areas of the non-active area (NA).

For example, as shown in FIG. 10, the dam area (DA) is located between a pad area where a plurality of X-touch pads (X-TP) and a plurality of Y-touch pads (Y-TP) are formed in the non-active area (NA) and the active area (AA), and the dam area (DA) can be provided with a primary dam (DAM1) adjacent to the active area (AA) and a secondary dam (DAM2) adjacent to the pad area.

One or more dams (DAM) arranged in the dam area (DA) can prevent a liquid organic encapsulation layer (PCL) from collapsing toward the non-active area (NA) and infiltrating into the pad area when the liquid organic encapsulation layer (PCL) is dropped into the active area (AA).

This effect can be further increased in the case where the primary dam (DAM1) and the secondary dam (DAM2) are provided, as shown in FIG. 10.

The primary dam (DAM) and/or the secondary dam (DAM2) can be formed as a single-layered or a multi-layered structure. For example, the primary dam (DAM1) and/or the secondary dam (DAM2) can be formed of the same material as at least one of the banks (BANK) and spacers (not shown) at the same time. In this case, the dam structure can be formed without requiring an additional mask process and increasing costs.

In addition, the primary dam (DAM1) and the secondary dam (DAM2) can have a structure in which the first inorganic encapsulation layer (PAS1) and/or the second inorganic encapsulation layer (PAS2) are stacked on the banks (BANK) as shown in FIG. 10.

In addition, the organic encapsulation layer (PCL) containing an organic material can be positioned only inside the primary dam (DAM1) as shown in FIG. 10.

Alternatively, the organic encapsulation layer (PCL) containing an organic material can also be positioned on the top of at least a part of the primary dam (DAM1) and the secondary dam (DAM2). For example, the organic encapsulation layer (PCL) can also be positioned on the top of the primary dam (DAM1).

The second inorganic encapsulation layer (PAS2) can be formed so as to cover the top surface and the side surface of each of the organic encapsulation layer (PCL) and the first inorganic encapsulation layer (PAS1) on the substrate (SUB) on which the organic encapsulation layer (PCL) is formed. The second inorganic encapsulation layer (PAS2) minimizes or prevents external moisture or oxygen from penetrating into the first inorganic encapsulation layer (PAS1) and the organic encapsulation layer (PCL). The second inorganic encapsulation layer (PAS2) is formed of an inorganic insulating material such as silicon nitride (SiNx), silicon oxide (SiOx), silicon oxynitride (SiON), aluminum oxide (Al2O3), or the like.

A touch buffer film (T-BUF) can be arranged on the encapsulation portion (ENCAP). The touch buffer film (T-BUF) can be provided between the touch sensor metal including X- and Y-touch electrodes (X-TE and Y-TE) and X- and Y-touch-electrode-connecting lines (X-CL and Y-CL) and the second electrode (E2) of the light-emitting device (ED).

The touch buffer film (T-BUF) can be designed to maintain the distance between the touch sensor metal and the second electrode (E2) of the light-emitting device (ED) at a predetermined minimum separation value (e.g., 1 μm). Accordingly, it is possible to reduce or prevent the parasitic capacitance generated between the touch sensor metal and the second electrode (E2) of the light-emitting device (ED), thereby preventing deterioration of touch sensitivity due to the parasitic capacitance.

The touch sensor metal including the X- and Y-touch electrodes (X-TE and Y-TE) and the X- and Y-touch-electrode-connecting lines (X-CL and Y-CL) can be arranged on the encapsulation portion (ENCAP) without the touch buffer film (T-BUF).

In addition, the touch buffer film (T-BUF) can prevent chemical solutions (a developer, etchant, or the like), used in the process of manufacturing the touch sensor metal arranged on the touch buffer film (T-BUF), or external moisture from penetrating into the light-emitting layer (EL) including organic materials. Accordingly, the touch buffer film (T-BUF) is able to prevent damage to the light-emitting layer (EL), which is vulnerable to chemical solutions or moisture.

The touch buffer film (T-BUF) is formed of an organic insulating material, which is able to be formed at a low temperature of less than a predetermined temperature (e.g., 100 degrees C.) and has a low permittivity of 1 to 3, in order to prevent damage to the light-emitting layer (EL), which includes an organic material vulnerable to high temperatures. For example, the touch buffer film (T-BUF) can be formed of an acrylic-based, epoxy-based, or siloxane-based material. The touch buffer film (T-BUF), which is made of an organic insulating material so as to have a planarization property, can prevent damage to the respective encapsulation layers (PAS1, PCL, and PAS2) constituting the encapsulation portion (ENCAP) and the breakage of the touch sensor metal formed on the touch buffer film (T-BUF) due to warping of the organic light-emitting display device.

According to a mutual-capacitance-based touch sensor structure, the X-touch electrode lines (X-TEL) and the Y-touch electrode lines (Y-TEL) can be arranged so as to intersect each other on the touch buffer film (T-BUF).

The Y-touch electrode line (Y-TEL) can include a plurality of Y-touch electrodes (Y-TE) and a plurality of Y-touch-electrode-connecting lines (Y-CL) for electrically connecting the plurality of Y-touch electrodes (Y-TE) to each other.

As shown in FIG. 10, the plurality of Y-touch electrodes (Y-TE) and the plurality of Y-touch-electrode-connecting lines (Y-CL) can be provided in different layers, with a touch insulating film (ILD) interposed therebetween.

The plurality of Y-touch electrodes (Y-TE) can be spaced a predetermined distance apart from each other in the y-axis direction. Each of the plurality of Y-touch electrodes (Y-TE) can be electrically connected to another Y-touch electrode (Y-TE) adjacent thereto in the y-axis direction by means of the Y-touch-electrode-connecting line (Y-CL).

The Y-touch-electrode-connecting line (Y-CL) can be formed on the touch buffer film (T-BUF) so as to be exposed through a touch contact hole passing through the touch insulating film (ILD), and can be electrically connected to two Y-touch electrodes (Y-TE), which are adjacent to each other in the y-axis direction.

The Y-touch-electrode-connecting line (Y-CL) can be arranged so as to overlap the bank (BANK). Accordingly, it is possible to prevent the aperture ratio from being lowered due to the Y-touch-electrode-connecting line (Y-CL).

The X-touch electrode line (X-TEL) can include a plurality of X-touch electrodes (X-TE) and a plurality of X-touch-electrode-connecting lines (X-CL) for electrically connecting the plurality of X-touch electrodes (X-TE) to each other. The plurality of X-touch electrodes (X-TE) and the plurality of X-touch-electrode-connecting lines (X-CL) can be provided in different layers with the touch insulating film (ILD) interposed therebetween.

The plurality of X-touch electrodes (X-TE) can be spaced a predetermined distance apart from each other in the x-axis direction on the touch insulating film (ILD). Each of the plurality of X-touch electrodes (X-TE) can be electrically connected to another X-touch electrode (X-TE) adjacent thereto in the x-axis direction through the X-touch-electrode-connecting line (X-CL).

The X-touch-electrode-connecting line (X-CL) can be arranged in the same plane as the X-touch electrodes (X-TE), and can be electrically connected to two X-touch electrodes (X-TE), which are adjacent to each other in the x-axis direction, without separate contact holes, or can be formed integrally with two X-touch electrodes (X-TE), which are adjacent to each other in the x-axis direction.

The X-touch-electrode-connecting line (X-CL) can be arranged to overlap the bank (BANK). Accordingly, it is possible to prevent the aperture ratio from being lowered due to the X-touch-electrode-connecting line (X-CL).

The Y-touch electrode line (Y-TEL) can be electrically connected to the touch-driving circuit (TDC) via the Y-touch-routing line (Y-TL) and the Y-touch pad (Y-TP). Similarly, the X-touch electrode line (X-TEL) can be electrically connected to the touch-driving circuit (TDC) via the X-touch-routing line (X-TL) and the X-touch pad (X-TP).

A pad cover electrode covering the X-touch pad (X-TP) and the Y-touch pad (Y-TP) can be further arranged.

The X-touch pad (X-TP) can be formed separately from the X-touch-routing line (X-TL), or can be formed by extending the X-touch-routing line (X-TL). The Y-touch pad (Y-TP) can be formed separately from the Y-touch-routing line (Y-TL), or can be formed by extending the Y-touch-routing line (Y-TL).

In the case where the X-touch pad (X-TP) is formed by extending the X-touch-routing line (X-TL) and the Y-touch pad (Y-TP) is formed by extending the Y-touch-routing line (Y-TL), the X-touch pad (X-TP), the X-touch-routing line (X-TL), the Y-touch pad (Y-TP), and the Y-touch-routing line (Y-TL) can be formed of the same first conductive material. The first conductive material can be formed in a single-layered or multi-layered structure using a metal, such as Al, Ti, Cu, or Mo, which exhibits high corrosion resistance, high acid resistance, and high conductivity.

For example, the X-touch pad (X-TP), the X-touch-routing line (X-TL), the Y-touch pad (Y-TP), and the Y-touch-routing line (Y-TL), made of the first conductive material, can be formed in a three-layered structure such as Ti/Al/Ti or Mo/Al/Mo.

The pad cover electrode capable of covering the X-touch pad (X-TP) and the Y-touch pad (Y-TP) can be made of a second conductive material that is the same as the X- and Y-touch electrodes (X-TE and Y-TE). The second conductive material can be a transparent conductive material, such as ITO or IZO, which exhibits high corrosion resistance and high acid resistance. The pad cover electrode can be formed to be exposed by the touch buffer film (T-BUF), so that the pad cover electrode can be bonded to the touch-driving circuit (TDC) or can be bonded to a circuit film on which the touch-driving circuit (TDC) is mounted.

The touch buffer film (T-BUF) can be formed to cover the touch sensor metal, thereby preventing the touch sensor metal from being corroded by external moisture or the like. For example, the touch buffer film (T-BUF) can be formed of an organic insulating material, or can be formed in the form of a circular polarizer or a film of an epoxy or acrylic material. The touch buffer film (T-BUF) need not be provided on the encapsulation portion (ENCAP). That is, the touch buffer film (T-BUF) need not be an essential element.

The Y-touch-routing line (Y-TL) can be electrically connected to the Y-touch electrodes (Y-TE) through touch-routing-line contact holes, or can be integral with the Y-touch electrode (Y-TE).

The Y-touch-routing line (Y-TL) can be extended to the non-active area (NA), and can pass over the top and side of the encapsulation portion (ENCAP) and the top and side of the dam (DAM) so as to be electrically connected to the Y-touch pad (Y-TP). Accordingly, the Y-touch-routing line (Y-TL) can be electrically connected to the touch-driving circuit (TDC) via the Y-touch pad (Y-TP).

The Y-touch-routing line (Y-TL) can transmit a touch-sensing signal from the Y-touch electrode (Y-TE) to the touch-driving circuit (TDC), or can receive a touch-driving signal from the touch-driving circuit (TDC) to thus transfer the same to the Y-touch electrode (Y-TE).

The X-touch-routing line (X-TL) can be electrically connected to the X-touch electrodes (X-TE) through touch-routing-line contact holes, or can be integral with the X-touch electrode (X-TE).

The X-touch-routing line (X-TL) can extend to the non-active area (NA), and can pass over the top and side of the encapsulation portion (ENCAP) and the top and side of the dam (DAM) so as to be electrically connected to the X-touch pad (X-TP). Accordingly, the X-touch-routing line (X-TL) can be electrically connected to the touch-driving circuit (TDC) via the X-touch pad (X-TP).

The X-touch-routing line (X-TL) can receive a touch-driving signal from the touch-driving circuit (TDC) to thus transfer the same to the X-touch electrode (X-TE), or can transfer a touch-sensing signal from the X-touch electrode (X-TE) to the touch-driving circuit (TDC).

The layout of the X-touch-routing lines (X-TL) and the Y-touch-routing lines (Y-TL) can be variously modified depending on the panel design.

A touch protection film (PAC) can be arranged on the X-touch electrode (X-TE) and the Y-touch electrode (Y-TE). The touch protection film (PAC) can be extended to the front or back of the dam (DAM) so as to be arranged on the X-touch-routing line (X-TL) and the Y-touch-routing line (Y-TL).

The cross-sectional view of FIG. 10 shows a conceptual structure, and thus the positions, thicknesses, or widths of the respective patterns (respective layers or respective electrodes) can vary depending on the viewing directions or positions; connection structures of the respective patterns can vary; other layers can be further provided in addition to the illustrated layers; and some of the illustrated layers can be omitted or integrated. For example, the width of the bank (BANK) can be smaller than that illustrated in the drawing, and the height of the dam (DAM) can be less than or greater than that illustrated in the drawing.

Figure 11:
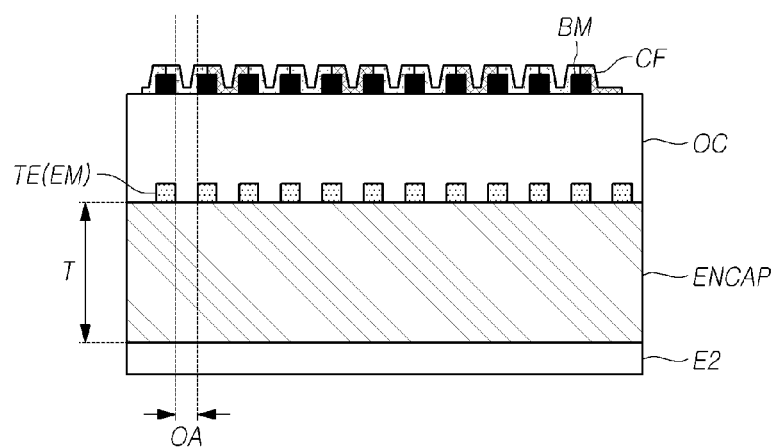
FIGS. 11 and 12 are views illustrating examples of a cross-sectional structure of a display panel including a color filter according to embodiments of the present disclosure.
Figure 12:
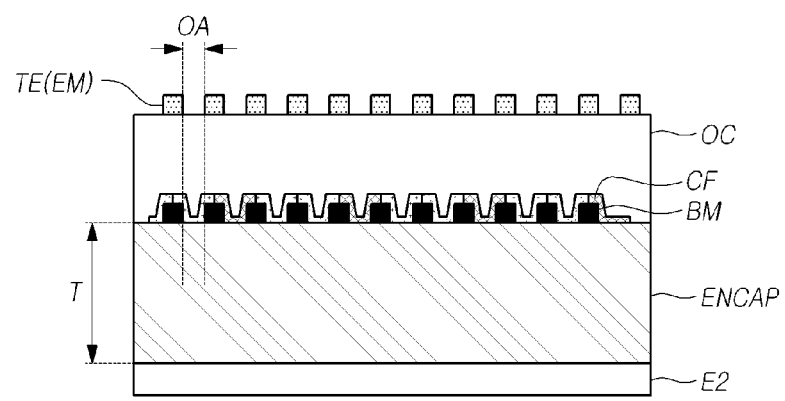

FIGS. 11 and 12 are views illustrating examples of a cross-sectional structure of a display panel (DISP) including a color filter (CF) according to embodiments of the present disclosure.

Referring to FIGS. 11 and 12, in the case where the touch panel (TSP) is embedded in the display panel (DISP) and the display panel (DISP) is implemented as an organic light-emitting display panel, the touch panel (TSP) can be positioned on the encapsulation portion (ENCAP) in the display panel (DISP). In other words, the touch sensor metal, such as a plurality of touch electrodes (TE), a plurality of touch-routing lines (TL), and the like, can be positioned on the encapsulation portion (ENCAP) in the display panel (DISP).

As described above, since the touch electrodes (TE) are provided on the encapsulation portion (ENCAP), it is possible to form the touch electrodes (TE) without significantly affecting the display performance and display-related layer formation.

Referring to FIGS. 11 and 12, a second electrode (E2), which can be a cathode electrode of an organic light-emitting diode (OLED), can be provided below the encapsulation portion (ENCAP).

The thickness (T) of the encapsulation portion (ENCAP) can be, for example, 1 micrometer or more.

As described above, it is possible to reduce the parasitic capacitance generated between the second electrode (E2) and the touch electrode (TE) of the organic light-emitting diode (OLED) by designing the encapsulation portion (ENCAP) so as to have a thickness of 1 micrometer or more. Thus, it is possible to prevent deterioration in touch sensitivity due to parasitic capacitance.

As described above, each of the plurality of touch electrodes (TE) can be patterned in the form of a mesh in which the electrode metal (EM) has two or more openings (OA), and each of the two or more openings (OA) can correspond to one or more subpixels or the light-emitting area thereof in the vertical direction.

As described above, the electrode metal (EM) of the touch electrode (TE) can be patterned such that the light-emitting area of one or more subpixels is located so as to correspond to the position of each of two or more openings (OA) provided in the area of the touch electrode (TE) in a plan view, thereby increasing the luminous efficiency of the display panel (DISP).

As shown in FIGS. 11 and 12, a black matrix (BM) can be arranged on the display panel (DISP), and a color filter (CF) can be further arranged thereon.

The position of the black matrix (BM) can correspond to the position of the electrode metal (EM) of the touch electrode (TE).

The positions of a plurality of color filters (CF) correspond to the positions of a plurality of touch electrodes (TE) or electrode metals (EM) constituting the plurality of touch electrodes (TE).

As described above, since the plurality of color filters (CF) is provided at the positions corresponding to the positions of a plurality of openings (OA), it is possible to improve the luminous performance of the display panel (DISP).

The vertical positional relationship between the plurality of color filters (CF) and the plurality of touch electrodes (TE) will be described below.

As shown in FIG. 11, the plurality of color filters (CF) and black matrixes (BM) can be provided on the plurality of touch electrodes (TE).

In this case, the plurality of color filters (CF) and black matrixes (BM) can be positioned on an overcoat layer (OC) arranged on the plurality of touch electrodes (TE). The overcoat layer (OC) can or need not be the same layer as the touch protection film (PAC) shown in FIG. 10.

As shown in FIG. 12, the plurality of color filters (CF) and black matrixes (BM) can be provided under the plurality of touch electrodes (TE).

In this case, the plurality of touch electrodes (TE) can be positioned on the overcoat layer (OC) on the plurality of color filters (CF) and black matrixes (BM). The overcoat layer (OC) can or need not be the same layer as the touch buffer film (T-BUF) or the touch insulating film (ILD) in FIG. 10.

It is possible to realize a touch function while minimizing the influence on the configuration for driving the display of the touch display device 100 by arranging the touch electrodes (TE) on the encapsulation portion (ENCAP) as described above.

In this case, a difference in sensing sensitivity depending on position in the display panel (DISP) can be incurred, or a difference in sensing sensitivity depending on a movement direction of a finger/pen can be incurred. In addition, the difference in sensing sensitivity can degrade the accuracy of sensing.

Figure 13:
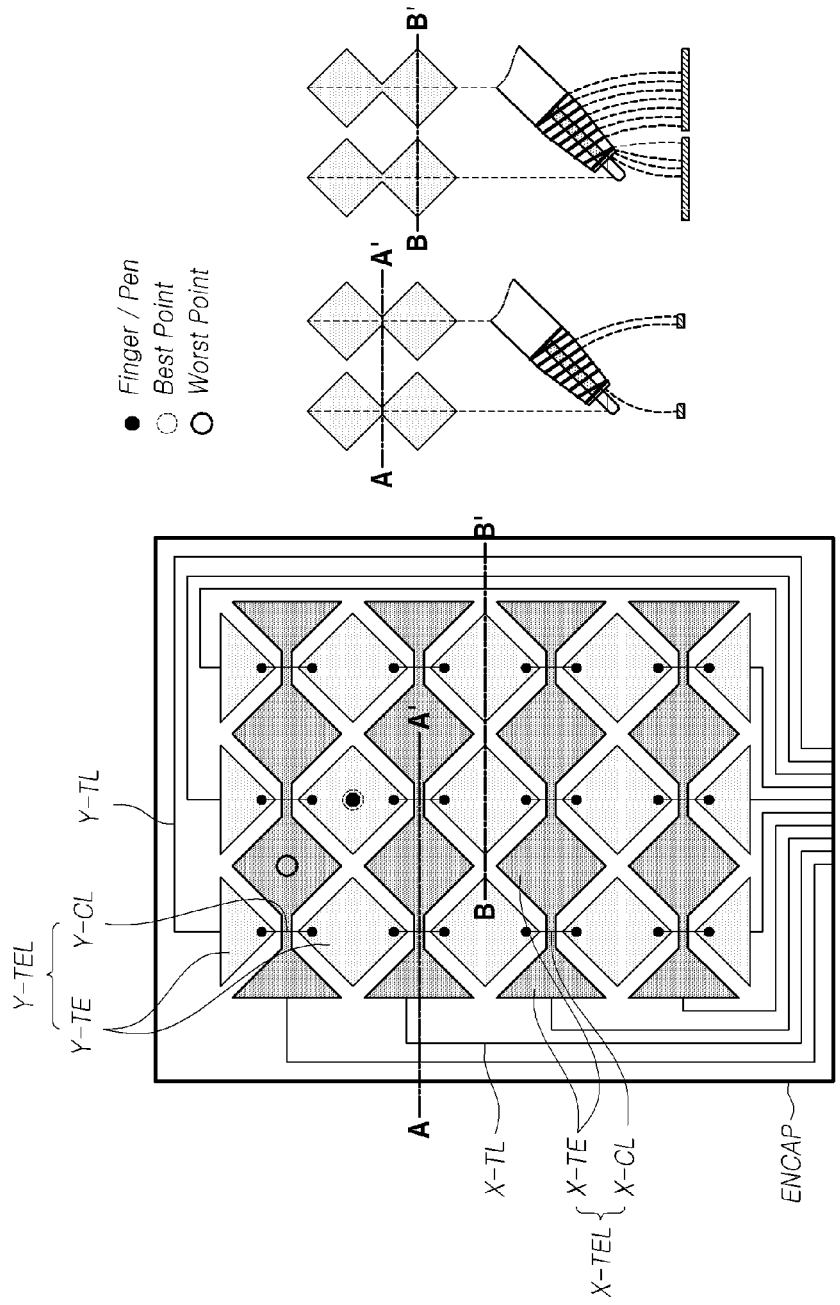
FIG. 13 is a view illustrating an example of a difference in sensing performance depending on position in a touch display device according to embodiments of the present disclosure.

FIG. 13 is a view illustrating an example of a difference in sensing performance depending on position in a touch display device 100 according to embodiments of the present disclosure.

Referring to FIG. 13, a plurality of X-touch electrode lines (X-TEL) and a plurality of Y-touch electrode lines (Y-TEL) are arranged on an encapsulation portion (ENCAP). In addition, a plurality of X-touch-routing lines (X-TL) connected to the respective X-touch electrode lines (X-TEL) and a plurality of Y-touch-routing lines (Y-TL) connected to the respective Y-touch electrode lines (Y-TEL) can be arranged.

In the case where the Y-touch electrode line (Y-TEL) serves as a sensing touch electrode line and a pen touch is sensed, if the pen is positioned on the Y-touch electrode (Y-TE), the sensing sensitivity can be the best, whereas if the pen is positioned on the X-touch electrode (X-TE), the sensing sensitivity can be the worst.

In addition, if the pen is positioned on the line A-A', the area of the Y-touch electrode line (Y-TEL) that forms an electric field with the pen is small, so that signal sensitivity can be low. Further, if the pen is positioned on the line B-B', the area of the Y-touch electrode line (Y-TEL) that forms an electric field with the pen is large, so that signal sensitivity can be high.

Therefore, the above difference in signal sensitivity depending on the position of a pen can degrade the accuracy of tilt-sensing or hover-sensing of the pen.

FIG. 14 is a view illustrating an example of a difference in sensing performance depending on a movement direction in a touch display device 100 according to embodiments of the present disclosure.

FIG. 14 shows an example in which the X-touch electrode line (X-TEL) arranged on the encapsulation portion (ENCAP) serves as a sensing touch electrode line.

If the finger/pen moves in the direction ①, a low signal is sensed in a first X-touch electrode line (X-TEL1), and the signal sensed in a second X-touch electrode line (X-TEL2) has a large deviation depending on the position of the finger/pen on the second X-touch electrode line (X-TEL2).

In addition, if the finger/pen moves in the direction ②, the signal sensed in the first X-touch electrode line (X-TEL1) can sharply decrease, and the signal sensed in the second X-touch electrode line (X-TEL2) can significantly increase according to the movement of the finger/pen.

That is, if the touch electrodes (TE) are arranged in a diamond shape as illustrated in the above example, a difference in sensing sensitivity depending on the position of the finger/pen can occur, and such a difference in sensing sensitivity can occur in the case where the X-touch electrode (X-TE) or the Y-touch electrode (Y-TE) serves as a sensing touch electrode.

Therefore, the embodiments of the present disclosure provide a structure of touch electrodes (TE) capable of making signal sensitivity uniform depending on the position of a finger/pen while improving signal sensitivity, a touch panel (TSP), and a touch display device 100 in which the above touch electrodes (TE) are arranged.

Figure 15:
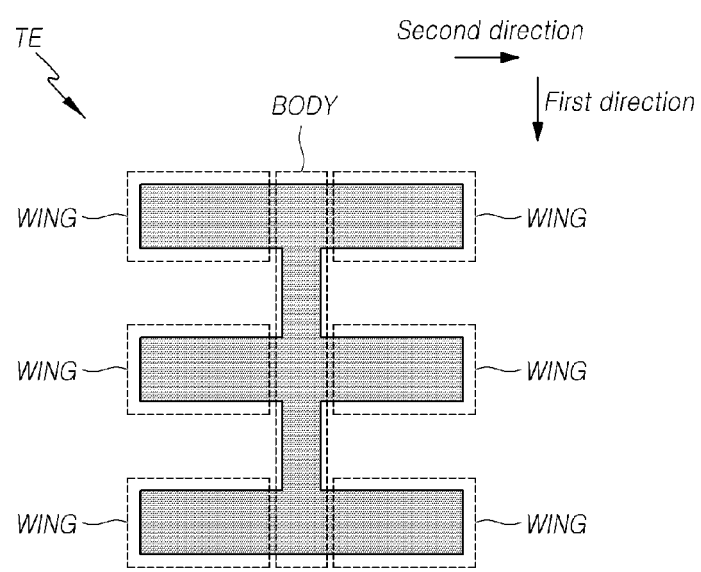
FIG. 15 is a view illustrating an example of another type of touch electrode arranged on a display panel according to embodiments of the present disclosure.

FIG. 15 is a view illustrating an example of another type of touch electrode (TE) arranged on a display panel (DISP) according to embodiments of the present disclosure.

Referring to FIG. 15, a touch electrode (TE) according to embodiments of the present disclosure can include a body (BODY) arranged in a first direction and one or more wings (WING) arranged in a second direction, intersecting the first direction, and connected to the body (BODY).

In some cases, the body (BODY) of the touch electrode (TE) can be arranged in the second direction, and the wing (WING) can be arranged in the first direction.

The width of the body (BODY) of the touch electrode (TE) can be less than the width of the wing (WING). In some cases, the width of the body (BODY) can be greater than the width of the wing (WING). Alternatively, the width of the body (BODY) and the width of the wing (WING) can be the same.

One or more wings (WING) can be connected to both sides of the body (BODY) of the touch electrode (TE). For example, six wings (WING) can be connected to both sides of the body (BODY). Alternatively, two, four, or eight wings (WING) can be connected to the body (BODY), and the number of wings (WING) connected to the body (BODY) can vary depending on the arrangement position of the touch electrode (TE), or the wings (WING) can be connected to only one side of the body (BODY).

Although FIG. 15 illustrates an example in which the touch electrode (TE) is a transparent electrode having no openings, a mesh-type touch electrode (TE) can also be provided as described above.

The touch electrode (TE) including the body (BODY) and the wings (WING) can constitute the X-touch electrode line (X-TEL) or the Y-touch electrode line (Y-TEL) in the display panel (DISP) according to the connection structure of the touch electrode (TE) with adjacent touch electrodes (TE).

In addition, the X-touch electrodes (X-TE) included in the X-touch electrode line (X-TEL) and the Y-touch electrodes (Y-TE) included in the Y-touch electrode line (Y-TEL) can be arranged such that the wings (WING) thereof interlock with each other.

Figure 16:
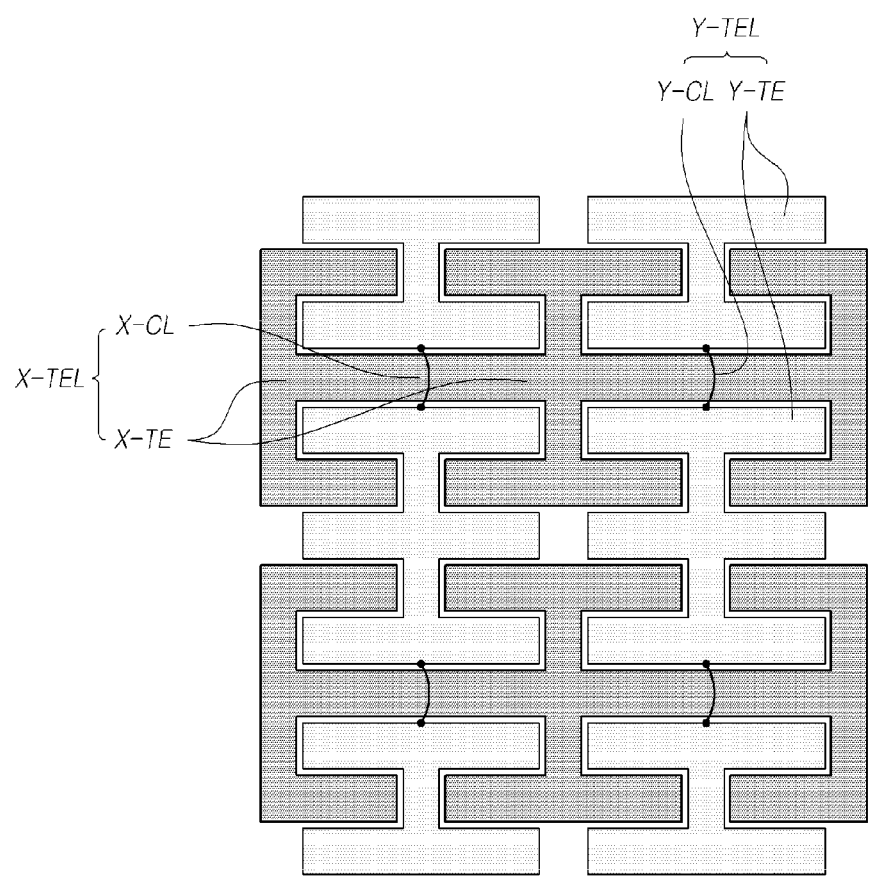
FIG. 16 is a view illustrating an example of a connection structure of the touch electrode shown in FIG. 15.

FIG. 16 is a view illustrating an example of a connection structure of the touch electrodes (TE) shown in FIG. 15.

FIG. 16 shows an example in which touch electrodes (TE) including a body (BODY) and one or more wings (WING) constitute the X-touch electrode lines (X-TEL) and the Y-touch electrode lines (Y-TEL), and more specifically an example in which six X-touch electrodes (X-TE) and six Y-touch electrodes (Y-TE) constitute two X-touch electrode lines (X-TEL) and two Y-touch electrode lines (Y-TEL), respectively.

The X-touch electrode (X-TE) arranged in the center, among the X-touch electrodes (X-TE) of the X-touch electrode line (X-TEL), can include six wings (WING) connected to both sides of the body (BODY). In addition, the X-touch electrode (X-TE) arranged outside, among the X-touch electrodes (X-TE) of the X-touch electrode line (X-TEL), can include three wings (WING) connected to one side of the body (BODY).

In addition, the X-touch electrodes (X-TE) arranged adjacent to each other in the second direction can be directly connected to each other by means of any one of the wings (WING) connected to the body (BODY).

For example, as shown in FIG. 16, the adjacent X-touch electrodes (X-TE) can be directly connected to each other by means of central wings (WING), among the wings (WING) connected to the bodies (BODY) of the X-touch electrodes (X-TE).

In this case, the wings (WING) of the adjacent X-touch electrodes (X-TE) can be directly connected to each other, or the central wings (WING) of the adjacent X-touch electrodes (X-TE) can be connected by an X-touch electrode connection line (X-CL).

The Y-touch electrode (Y-TE) arranged in the center, among the Y-touch electrodes (Y-TE) of the Y-touch electrode line (Y-TEL), can include six wings (WING) connected to both sides of the body (BODY). In addition, the Y-touch electrodes (Y-TE) arranged at the upper and lower portions, among the Y-touch electrodes (Y-TE) of the Y-touch electrode line (Y-TEL), can include four wings (WING) connected to both sides of the body (BODY).

That is, the touch electrode (TE) according to embodiments of the present disclosure can have a variety of structures according to the arrangement position of the touch electrode (TE) on the basis of a structure including the body (BODY) and the wings (WING) connected thereto.

The Y-touch electrodes (Y-TE) arranged adjacent to each other in the first direction can be electrically connected to each other by one or more connection patterns arranged in a different layer from the Y-touch electrodes (Y-TE). That is, the connection pattern arranged in a different layer from the Y-touch electrodes (Y-TE) so as to connect the adjacent Y-touch electrodes (Y-TE) to each other can be regarded as a Y-touch-electrode-connecting line (Y-CL).

In the above arrangement of the X-touch electrode line (X-TEL) and the Y-touch electrode line (Y-TEL), the bodies (BODY) of the X-touch electrodes (X-TE) and the bodies (BODY) of the Y-touch electrodes (Y-TE) can be alternately arranged in the second direction.

In addition, the wings (WING) of the X-touch electrodes (X-TE) and the wings (WING) of the Y-touch electrodes (Y-TE) can be alternately arranged in the first direction.

That is, in a structure in which the X-touch electrodes (X-TE) are connected to each other in the second direction and the Y-touch electrodes (Y-TE) are connected to each other in the first direction, the wings (WING) of the X-touch electrodes (X-TE) and the wings (WING) of the Y-touch electrodes (Y-TE) can be arranged to interlock with each other. For example, the the wings (WING) of the X-touch electrodes (X-TE) and the wings (WING) of the Y-touch electrodes (Y-TE) can be interdigitated, so that one wing (WING) of the X-touch electrodes (X-TE) can be interposed between adjacent wings (WINGS) of the Y-touch electrodes (Y-TE), and one wing (WING) of the Y-touch electrodes (Y-TE) can be interposed between adjacent wings (WING) of the X-touch electrodes (X-TE). In embodiments, such interdigitation can be repeated in the first direction or the second direction.

Therefore, the distance between the X-touch electrodes (X-TE) and the distance between the Y-touch electrodes (Y-TE) can be reduced in the display panel (DISP), thereby reducing the difference in sensing sensitivity depending on touch position. In embodiments, the FIG. 17 is a view illustrating another example of a connection structure of the touch electrode (TE) shown in FIG. 15.

Figure 17:
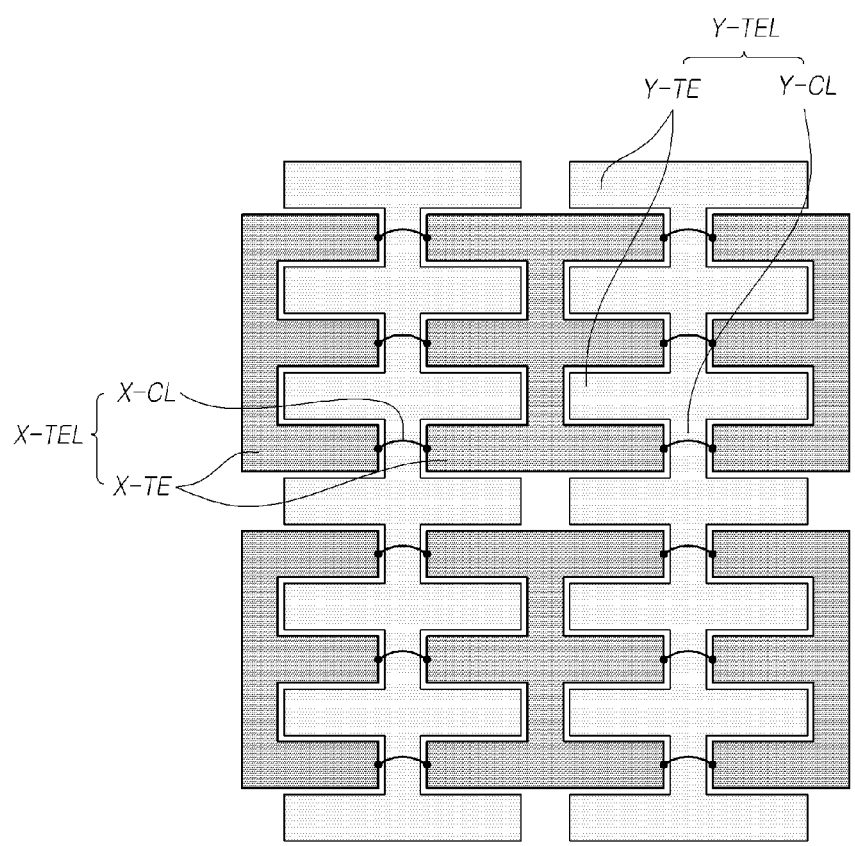
FIG. 17 is a view illustrating another example of a connection structure of the touch electrode shown in FIG. 15.

Referring to FIG. 17, X-touch electrodes (X-TE) arranged adjacent to each other in the second direction, among the X-touch electrodes (X-TE) constituting the X-touch electrode lines (X-TEL), can be electrically connected to each other by means of one or more connection patterns arranged in a different layer from the X-touch electrodes (X-TE).

The connection pattern for connecting the X-touch electrodes (X-TE) to each other can be regarded as an X-touch-electrode-connecting line (X-CL).

In addition, the Y-touch electrodes (Y-TE) arranged adjacent to each other in the first direction, among the Y-touch electrodes (Y-TE) constituting the Y-touch electrode lines (Y-TEL), can be directly connected to each other by the bodies (BODY) of the Y-touch electrodes (Y-TE).

Alternatively, the portion between the bodies (BODY) of the adjacent Y-touch electrodes (Y-TE) can be regarded as a Y-touch-electrode-connecting line (Y-CL).

In this arrangement, the bodies (BODY) of the X-touch electrodes (X-TE) and the bodies (BODY) of the Y-touch electrodes (Y-TE) can also be alternately arranged in the second direction, and the wings (WING) of the X-touch electrodes (X-TE) and the wings (WING) of the Y-touch electrodes (Y-TE) can be alternately arranged in the first direction.

As described above, the X-touch electrodes (X-TE) and the Y-touch electrodes (Y-TE) having the bodies (BODY) and the wings (WING) can be arranged so as to interlock with each other, and the adjacent touch electrodes (TE) can be connected to each other in various forms.

Figure 18:
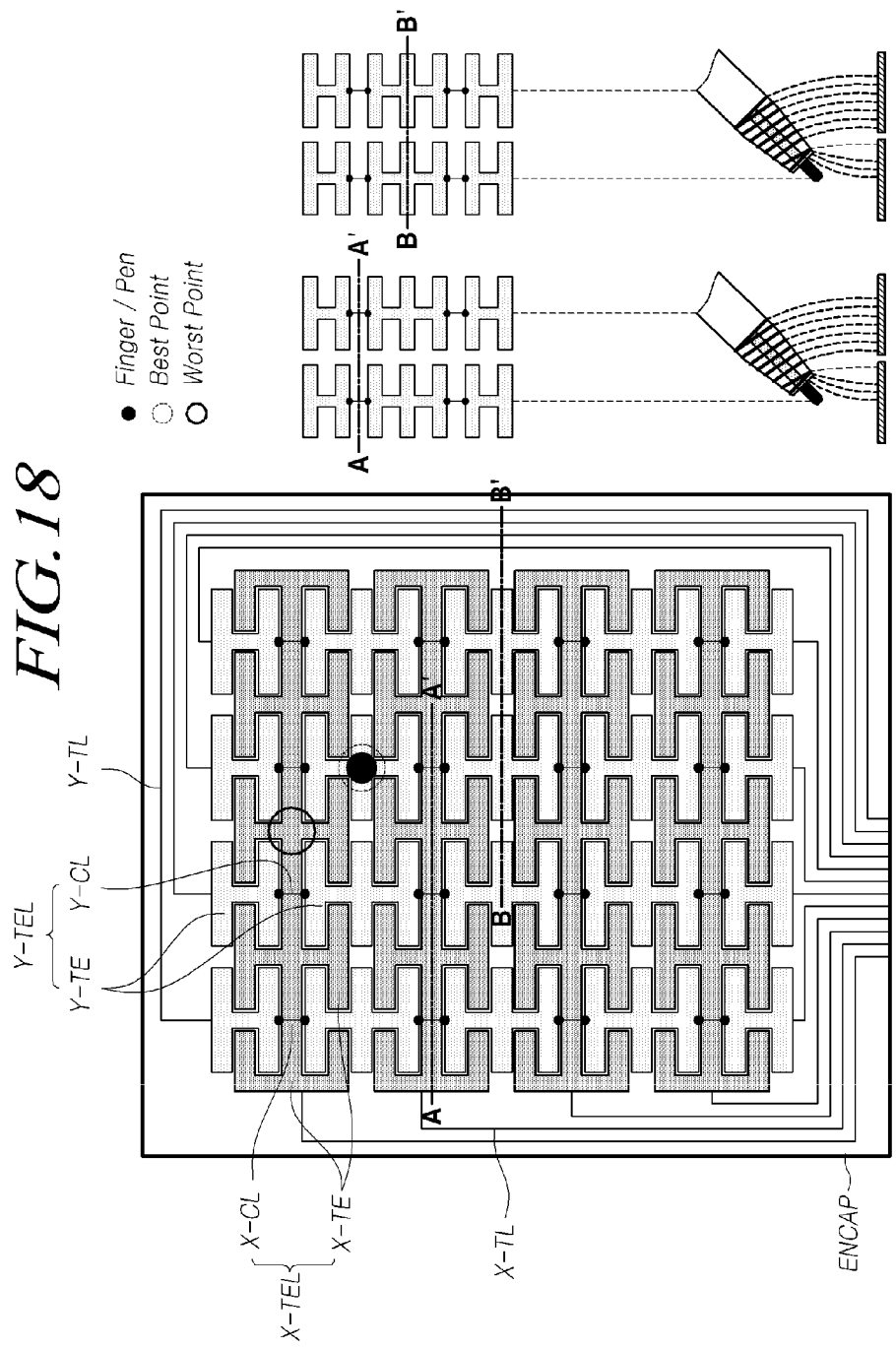
FIG. 18 is a view illustrating an example of a structure in which the touch electrodes shown in FIG. 15 are arranged on a display panel.

FIG. 18 is a view illustrating an example of a structure in which the touch electrodes (TE) shown in FIG. 15 are arranged on a display panel (DISP).

Referring to FIG. 18, a plurality of X-touch electrode lines (X-TEL) and a plurality of Y-touch electrode lines (Y-TEL) are arranged on an encapsulation portion (ENCAP). In addition, a plurality of X-touch-routing lines (X-TL) connected to the respective X-touch electrode lines (X-TEL) and a plurality of Y-touch-routing lines (Y-TL) connected to the respective Y-touch electrode lines (Y-TEL) can be arranged on the encapsulation portion (ENCAP).

Further, each of the plurality of X-touch electrodes (X-TE) and the plurality of Y-touch electrodes (Y-TE) can include a body (BODY) and one or more wings (WING).

In addition, the bodies (BODY) of the X-touch electrodes (X-TE) and the bodies (BODY) of the Y-touch electrodes (Y-TE) can be alternately arranged in the second direction, and the wings (WING) of the X-touch electrodes (X-TE) and the wings (WING) of the Y-touch electrodes (Y-TE) can be alternately arranged in the first direction.

That is, the wings (WING) of the X-touch electrodes (X-TE) and the wings (WING) of the Y-touch electrodes (Y-TE) can be arranged so as to interlock with each other.

In the case where the Y-touch electrode line (Y-TEL) serves as a sensing touch electrode line and a pen touch is sensed, the pen positioned on the Y-touch electrode (Y-TE) is superior to the pen positioned on the X-touch electrode (X-TE) in terms of sensing sensitivity.

In this case, the X-touch electrodes (X-TE) and the Y-touch electrodes (Y-TE) are arranged so as to interlock with each other. Thus, the difference in sensing sensitivity depending on the position of a pen can be reduced because the pen is close to the Y-touch electrode (Y-TE) even if the pen is located at any position.

For example, if the pen is positioned on the line A-A', since the wings (WING) of the Y-touch electrodes (Y-TE) are located close to the line A-A' even though the pen is positioned on the X-touch electrodes (X-TE), the electric field produced between the pen and the Y-touch electrode (Y-TE) can be sufficiently high.

In addition, if the pen is positioned on the line B-B', since the pen is positioned on the Y-touch electrode (Y-TE), a sufficiently strong electric field can be produced between the pen and the Y-touch electrode (Y-TE).

Accordingly, it is possible to reduce the difference in sensing sensitivity depending on position in the display panel (DISP) by improving the sensing sensitivity when the pen is positioned on the X-touch electrode (X-TE) and by reducing the difference with respect to the sensing sensitivity when the pen is positioned on the Y-touch electrode (Y-TE).

In addition, it is possible to improve the accuracy of touch sensing with respect to the display panel (DISP) by improving the sensing sensitivity and reducing the difference in sensing sensitivity depending on position.

Further, since the boundary area (i.e., the area where capacitance is generated) between the X-touch electrode (X-TE) and the Y-touch electrode (Y-TE) is increased, the sensitivity for a sensing signal can be increased during touch sensing, thereby improving the performance of touch sensing and reducing the sensing time.

In the touch electrode (TE) including a body (BODY) and wings (WING), the lengths and widths of the wings (WING) connected to the (BODY) can be constant, or at least one of the length and width of the wing (WING) need not be constant in order to further improve touch-sensing sensitivity.

Figure 19:
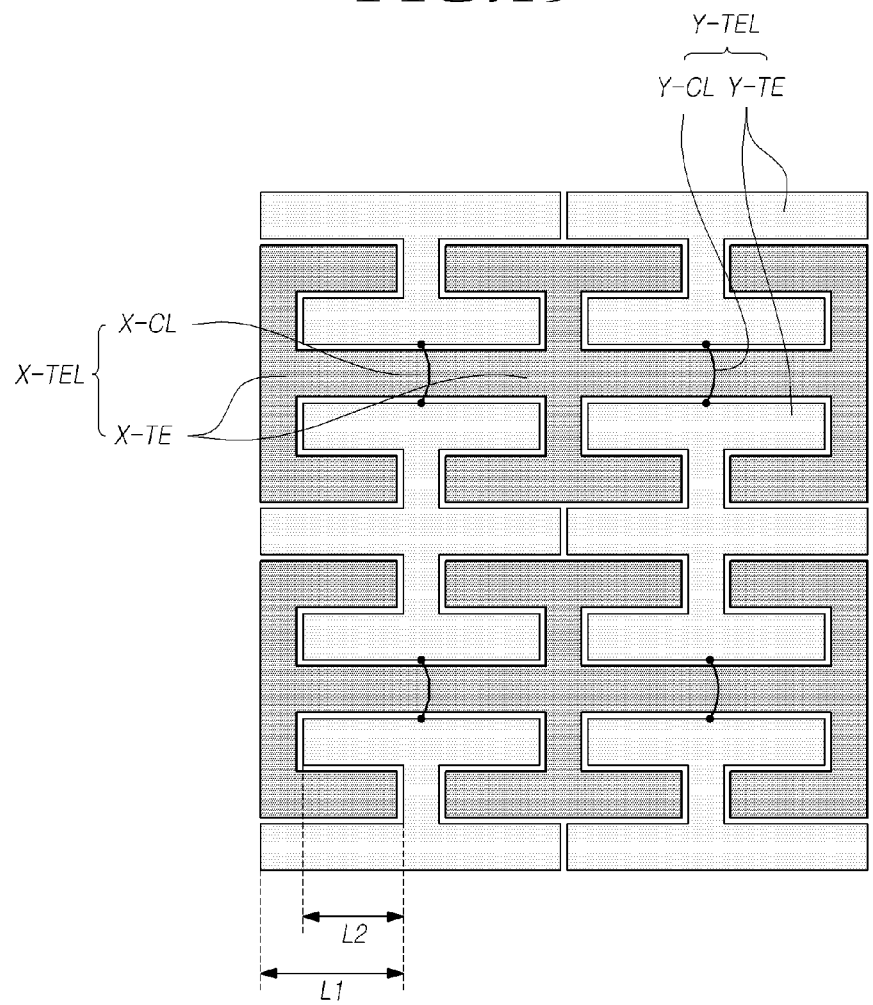
FIG. 19 is a view illustrating an example of another type of touch electrode arranged on a display panel and an example of a connection structure thereof according to embodiments of the present disclosure.

FIG. 19 is a view illustrating an example of another type of touch electrode (TE) arranged on a display panel (DISP) and an example of a connection structure thereof according to embodiments of the present disclosure.

Referring to FIG. 19, an X-touch electrode (X-TE) including a body (BODY) and one or more wings (WING) can be directly connected to another X-touch electrode (X-TE), which is adjacent thereto in the second direction, by any one of the wings (WING). Alternatively, the X-touch electrode (X-TE) can also be connected to the adjacent X-touch electrode (X-TE) by an X-touch-electrode-connecting line (X-CL) arranged between the wings (WING) of the adjacent X-touch electrodes (X-TE).

In addition, a Y-touch electrode (Y-TE) including a body (BODY) and one or more wings (WING) can be electrically connected to another Y-touch electrode (Y-TE), which is adjacent thereto in the first direction, by a connection pattern arranged in a different layer from the Y-touch electrodes (Y-TE). That is, the Y-touch electrode (Y-TE) can be electrically connected to the adjacent Y-touch electrode (Y-TE) by a Y-touch-electrode-connecting line (Y-CL) arranged in a different layer from the Y-touch electrodes (Y-TE).

In this case, the lengths of at least some of the wings (WING) connected to the body (BODY) of the Y-touch electrode (Y-TE) can be longer than the lengths of the remaining wings (WING).

For example, among the wings (WING) of the Y-touch electrode (Y-TE), the wing (WING) arranged between the X-touch electrodes (X-TE), which are arranged adjacent to each other in the first direction, can have a length L1. In addition, among the wings (WING) of the Y-touch electrode (Y-TE), the wing (WING) arranged between the wings (WING) of the X-touch electrode (X-TE) can have a length L2 less than the length L1.

In other words, the wing (WING) of the Y-touch electrode (Y-TE), which is arranged between the X-touch electrodes (X-TE), can be longer than the wing (WING) of the Y-touch electrode (Y-TE), which is arranged between the wings (WING) of the X-touch electrode (X-TE).

Accordingly, since the long wing (WING) of the Y-touch electrode (Y-TE) is arranged in the blank area between the X-touch electrodes (X-TE), which are arranged adjacent to each other in the first direction, the area where capacitance is produced between the X-touch electrode (X-TE) and the Y-touch electrode (Y-TE) can be increased, thereby improving the sensitivity of touch sensing.

In the case where the wings (WING) of the X-touch electrodes (X-TE), which are adjacent to each other in the second direction, are directly connected to each other, the wings (WING) for connecting the adjacent X-touch electrodes (X-TE) to each other can be longer than the remaining wings (WING).

That is, the lengths of the wings (WING) of the X-touch electrode (X-TE), as well as the Y-touch electrode (Y-TE), need not be constant, and the wing (WING) for connecting the adjacent X-touch electrodes (X-TE) can be long.

Further, in the structure of the touch electrodes (TE) shown in FIG. 17 and described above, among the wings (WING) of the Y-touch electrodes (Y-TE), the wing (WING) of the Y-touch electrode (Y-TE) arranged between the X-touch electrodes (X-TE), which are adjacent to each other in the first direction, can be longer than the wing (WING) of the Y-touch electrode (Y-TE) arranged between the wings (WING) of the X-touch electrode (X-TE).

In this case, the lengths of the wings (WING) of the X-touch electrode (X-TE) can be constant, but the lengths of the wings (WING) of the Y-touch electrode (Y-TE) need not be constant.

If the X-touch electrodes (X-TE) and the Y-touch electrodes (Y-TE) having the bodies (BODY) and the wings (WING) are arranged so as to interlock with each other as described above, the sensing sensitivity and accuracy can be improved by lengthening some wings (WING) to thus widen the sensing area.

Figure 20:
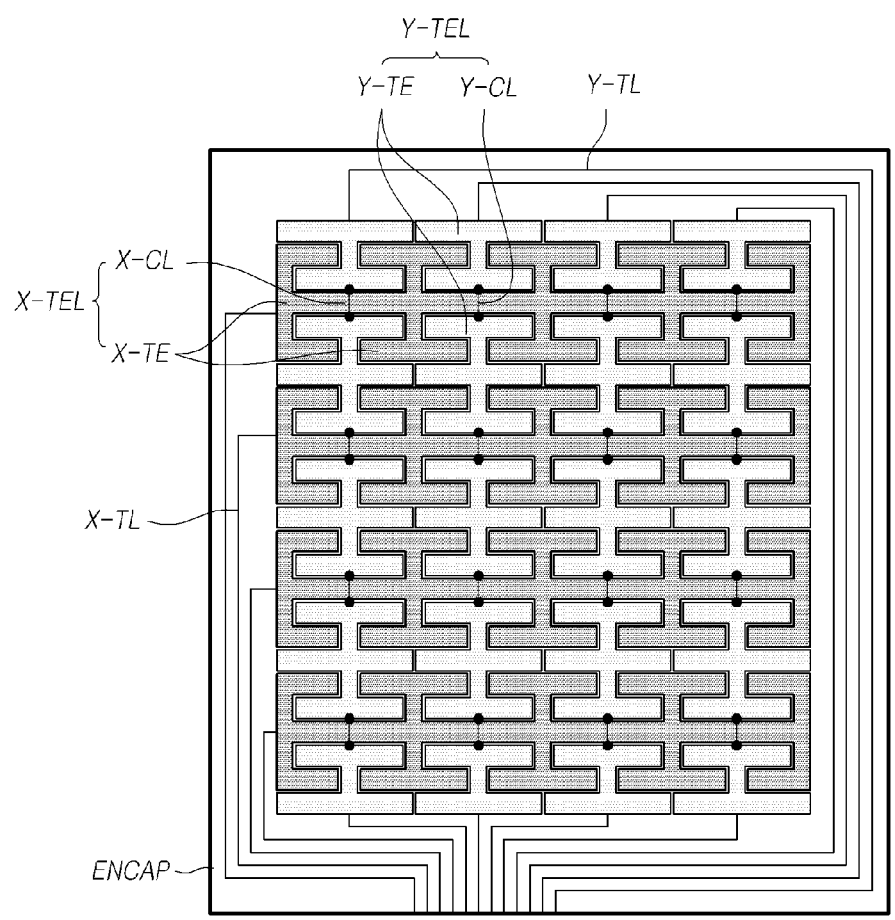
FIGS. 20 and 21 are views illustrating an example of a structure in which the touch electrode shown in FIG. 19 is arranged on a display panel.
Figure 21:
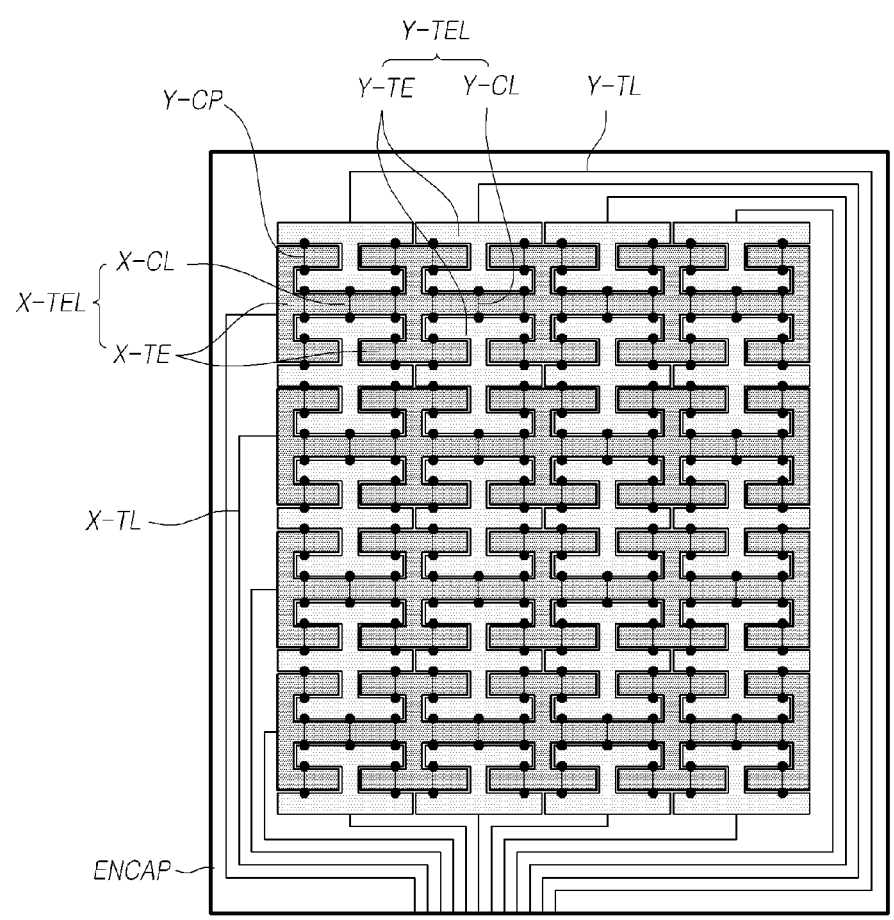

FIGS. 20 and 21 are views illustrating an example of a structure in which the touch electrodes (TE) shown in FIG. 19 are arranged on a display panel (DISP).

Referring to FIG. 20, X-touch electrode lines (X-TEL), Y-touch electrode lines (Y-TEL), X-touch-routing lines (X-TL), Y-touch-routing lines (Y-TL), and the like can be arranged on the encapsulation portion (ENCAP).

An X-touch electrode (X-TE), among the X-touch electrodes (X-TE) constituting the X-touch electrode line (X-TEL), can be directly connected to another X-touch electrode (X-TE) arranged adjacent thereto in the second direction by means of any one of the wings (WING) or by means of an X-touch-electrode-connecting line (X-CL) arranged between the wings (WING).

A Y-touch electrode (Y-TE), among the Y-touch electrodes (Y-TE) constituting the Y-touch electrode line (Y-TEL), can be electrically connected to another Y-touch electrode (Y-TE) arranged adjacent thereto in the first direction by means of a Y-touch-electrode-connecting line (Y-CL) arranged in a different layer from the Y-touch electrodes (Y-TE).

In this case, at least some of the wings (WING) connected to the body (BODY) of the Y-touch electrode (Y-TE) can be arranged to be longer than the remaining wings (WING).

That is, as shown in the example in FIG. 20, the wing (WING) of the Y-touch electrode (Y-TE), which is arranged between the X-touch electrodes (X-TE) adjacent to each other in the first direction, among the wings (WING) of the Y-touch electrode (Y-TE), can be longer than the wing (WING) of the Y-touch electrode (Y-TE), which is arranged between the wings (WING) of the X-touch electrode (X-TE).

Therefore, it is possible to further improve sensing performance depending on the position in the display panel (DISP) by increasing the area where the touch electrodes (TE) are arranged in the display panel (DISP) and the area where capacitance is produced between the X-touch electrode (X-TE) and the Y-touch electrode.

Furthermore, since the X-touch electrode (X-TE) and the Y-touch electrode (Y-TE) include a body (BODY) and wings (WING), a connection pattern can be further arranged in another layer, thereby reducing the resistance of the lines for connecting the touch electrodes (TE).

Referring to FIG. 21, in the arrangement of FIG. 20 described above, a plurality of connection patterns for connecting the wings (WING) of the Y-touch electrodes (Y-TE) can be arranged in a layer different from the Y-touch electrodes (Y-TE).

For example, a plurality of connection patterns for connecting the Y-touch electrodes (Y-TE), which are adjacent to each other in the first direction, can be arranged. Such a connection pattern is called "first connection pattern", which can be regarded as a Y-touch-electrode-connecting line (Y-CL).

In addition, the Y-touch electrode (Y-TE) can have a plurality of connection patterns for connecting one wing (WING) to another wing (WING), which are connected to the body (BODY) of the same Y-touch electrode (Y-TE). Such a connection pattern is called a "second connection pattern", which can be regarded as a Y-touch-electrode-connecting pattern (Y-CP).

That is, the pattern for connecting different bodies (BODY) or for connecting wings (WING) connected to different bodies (BODY) can be referred to as a "first connection pattern" or a "Y-touch-electrode-connecting line (Y-CL)". In addition, the pattern for connecting wings (WING) connected to the same body (BODY) can be referred to as a "second connection pattern" or a "Y-touch electrode connecting pattern (Y-CP)".

Further, in some cases, a plurality of connection patterns for connecting the X-touch electrodes (X-TE) to each other or for connecting the wings (WING) of the X-touch electrodes (X-TE) to each other can be further arranged.

Even if the connection pattern is arranged, the area where the connection pattern overlaps other touch electrodes (TE) can be reduced because the touch electrode (TE) includes a body (BODY) and wings (WING).

Therefore, since the additional arrangement of the connection patterns results in a small increase in the load, it is possible to reduce the resistance of the lines for connecting the Y-touch electrodes (Y-TE) by connecting the adjacent Y-touch electrodes (Y-TE) to each other or by arranging a plurality of connection patterns for connecting the wings (WING) of the Y-touch electrode (Y-TE) to each other.

In addition, it is possible to further increase the area where capacitance is produced between the X-touch electrode (X-TE) and the Y-touch electrode (Y-TE) by making arrangement such that the widths of the wings (WING) connected to the body (BODY) of the touch electrode (TE) are not constant.

Figure 22:
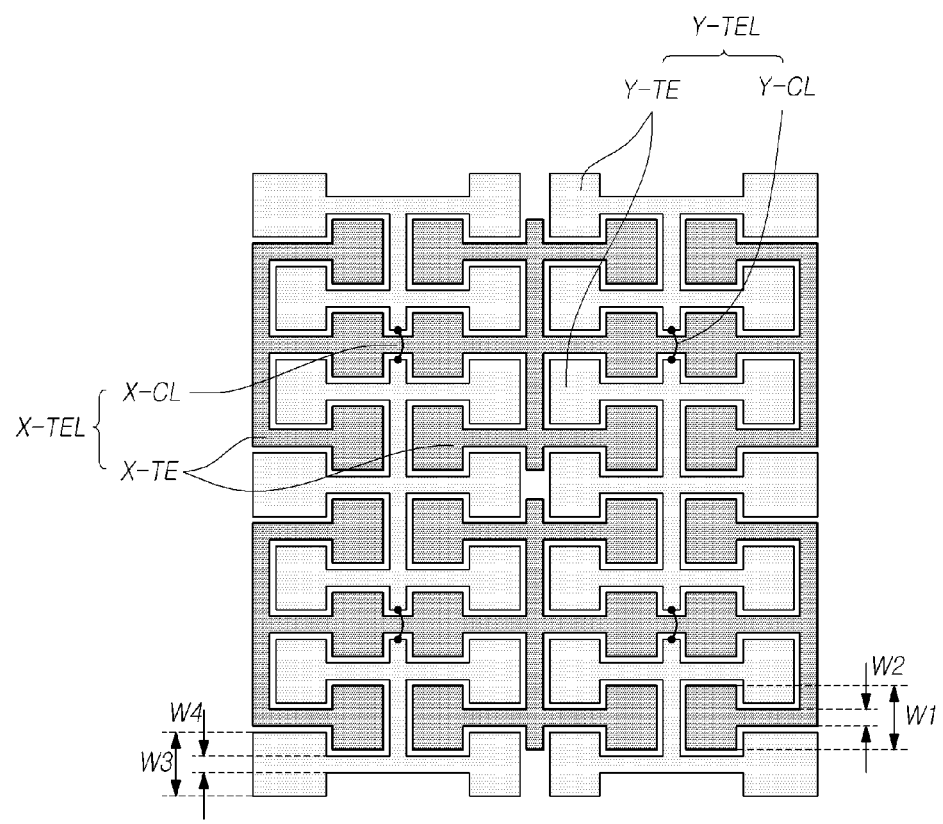
FIG. 22 is a view illustrating an example of another type of touch electrode arranged on a display panel and an example of a connection structure thereof according to embodiments of the present disclosure.

FIG. 22 is a view illustrating an example of another type of touch electrode (TE) arranged on a display panel (DISP) and an example of a connection structure thereof according to embodiments of the present disclosure.

Referring to FIG. 22, X-touch electrodes (X-TE), which are adjacent to each other in the second direction, can be connected to each other by means of any one of the wings (WING), and Y-touch electrodes (Y-TE), which are adjacent to each other in the first direction, can be connected to each other by means of a connection pattern arranged in a layer different from the Y-touch electrodes (Y-TE).

In addition, the width (W1) of the end portion of the wing (WING) of the X-touch electrode (X-TE) can be greater than the width (W2) of the remaining portion of the wing (WING).

Further, the width (W3) of the end portion of the wing (WING) of the Y-touch electrode (Y-TE) can be greater than the width (W4) of the remaining portion of the wing (WING).

In this case, the wide portion of the wing (WING) of the X-touch electrode (X-TE) and the wide portion of the wing (WING) of the Y-touch electrode (Y-TE) can be arranged in a zigzag arrangement.

The difference in width between the end portion and the remaining portion of the wings (WING) of the X-touch electrode (X-TE) and the Y-touch electrode (Y-TE) can increase the boundary area between the X-touch electrode (X-TE) and the Y-touch electrode (Y-TE).

Accordingly, the area where capacitance is produced between the X-touch electrode (X-TE) and the Y-touch electrode (Y-TE) can be increased so that the intensity of the touch sensing signal can be increased, thereby improving the sensitivity of touch sensing.

In addition, the body (BODY) of at least one of the X-touch electrode (X-TE) and the Y-touch electrode (Y-TE) can protrude outwards from the wing (WING) connected to the outermost portion of the body (BODY).

That is, as shown in the example in FIG. 22, the body (BODY) of the X-touch electrode (X-TE) can extend so as to protrude outwards from the outermost wing (WING), among the wings (WING) of the X-touch electrode (X-TE). In addition, the body (BODY) of the Y-touch electrode (Y-TE) can extend so as to protrude outwards from the outermost wing (WING), among the wings (WING) of the Y-touch electrode (Y-TE).

Therefore, the boundary area between the X-touch electrode (X-TE) and the Y-touch electrode (Y-TE) can be further increased, thereby improving the sensing sensitivity.

Figure 23:
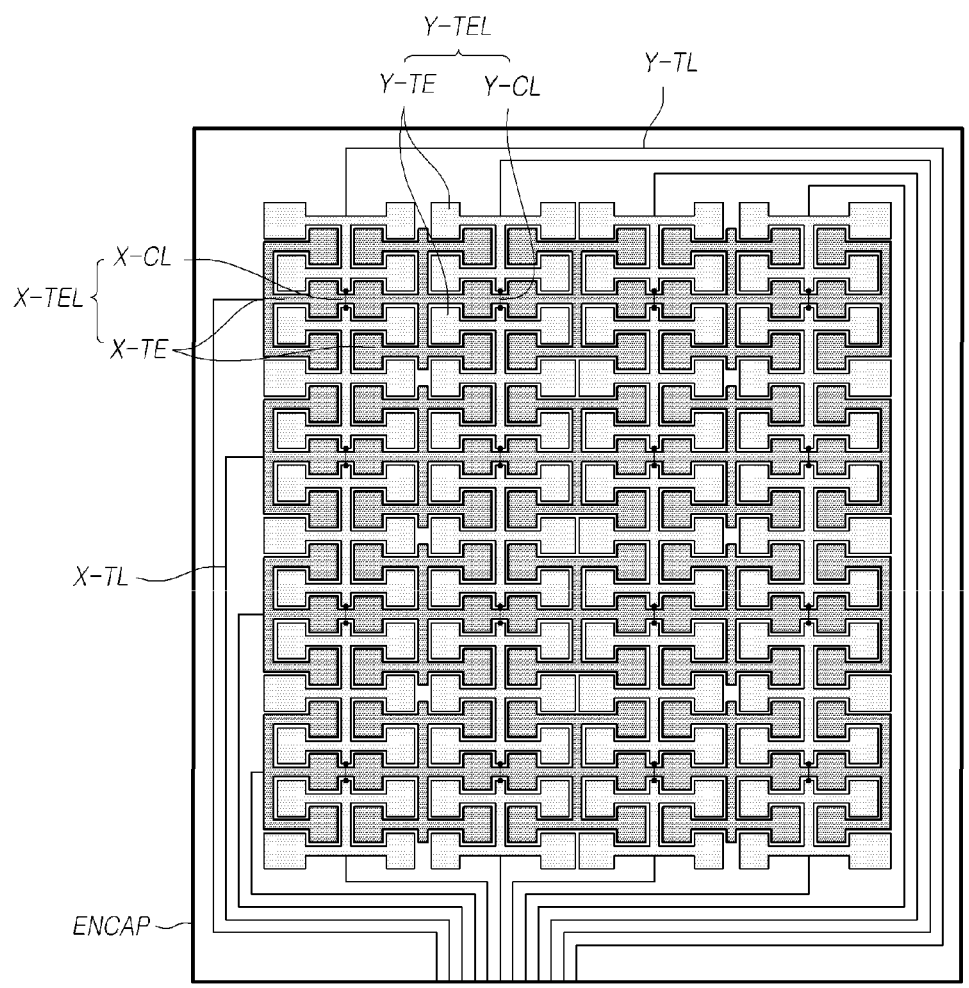
FIGS. 23 and 24 are views illustrating an example of a structure in which the touch electrodes shown in FIG. 22 are arranged on a display panel.
Figure 24:
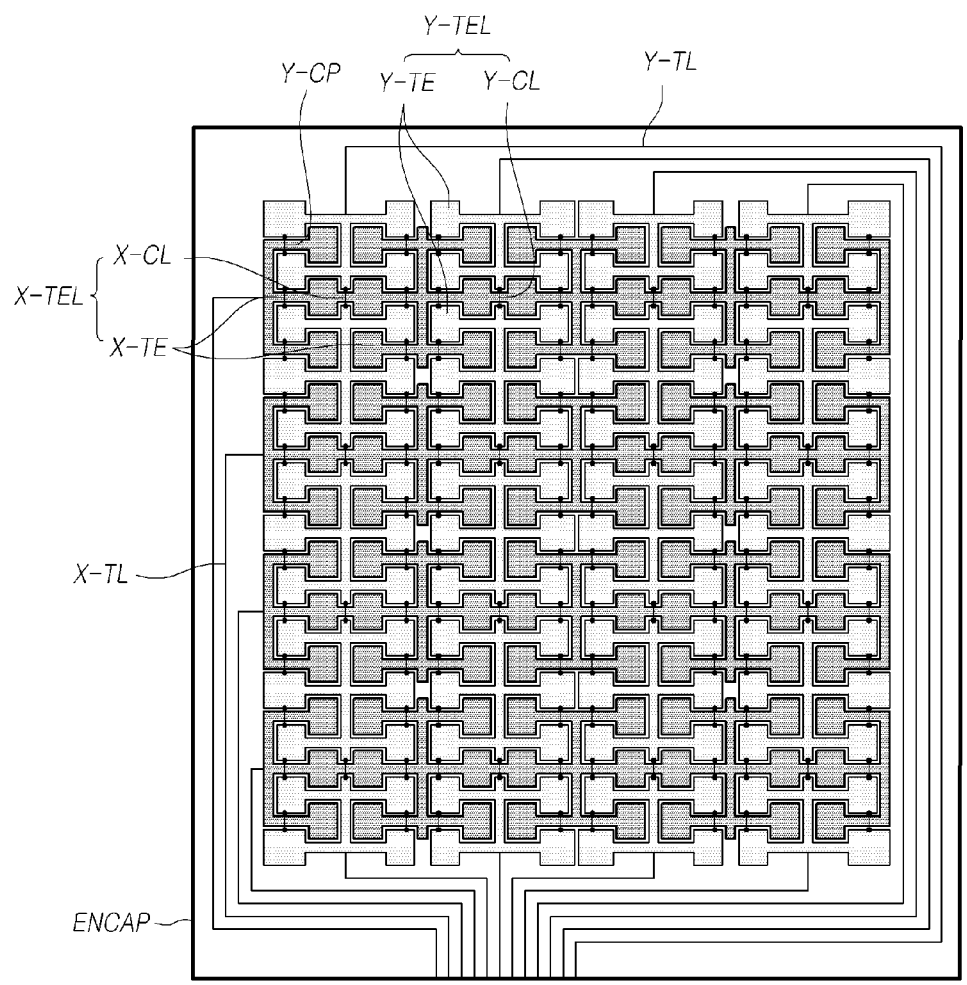

FIGS. 23 and 24 are views illustrating an example of a structure in which the touch electrodes (TE) shown in FIG. 22 are arranged on a display panel (DISP).

Referring to FIG. 23, X-touch electrode lines (X-TEL), Y-touch electrode lines (Y-TEL), X-touch-routing lines (X-TL), Y-touch-routing lines (Y-TL), and the like can be arranged on the encapsulation portion (ENCAP). In addition, the X-touch electrodes (X-TE) can be directly connected to each other in the second direction, and the Y-touch electrodes (Y-TE) can be connected to each other in the first direction by means of a connection pattern.

In this case, the wings of each of the X-touch electrode (X-TE) and the Y-touch electrode (Y-TE) can include a relatively wide portion and a relatively narrow portion. Although the wide portion of the wing (WING) can be provided at the end of the wing (WING), in some cases, the wide portion can be provided at other positions, such as in the middle of the wing (WING).

In addition, the wide portions of the wings (WING) of the X-touch electrodes (X-TE) and the wide portions of the wings (WING) of the Y-touch electrodes (Y-TE) can be arranged in a zigzag arrangement.

Accordingly, the boundary area between the X-touch electrode (X-TE) and the Y-touch electrode (Y-TE) can be increased, thereby improving the performance of touch sensing.

The end portion of the wing (WING) of the Y-touch electrode (Y-TE) arranged at the outermost position can also be wider than the remaining portion thereof.

The outer boundary of the narrow portion in the wing (WING) of the Y-touch electrode (Y-TE) can correspond to the boundary of the active area (AA).

In this case, a portion of the wing (WING) of the Y-touch electrode (Y-TE) arranged outside the active area (AA) {that is, arranged in the non-active area (NA)} can be used as a contact pad for connecting the Y-touch electrode (Y-TE) and the Y-touch-routing line (Y-TL) in some cases.

Alternatively, the wing (WING) arranged at the outermost position, among the wings (WING) of the Y-touch electrode (Y-TE) arranged at the outermost position, can be obtained by cutting the wing (WING) on the basis of the narrow portion of the wing (WING). That is, the width of the end portion of the wing (WING) is greater than the width of the remaining portion thereof while the outer boundary is located on a straight line.

In addition, an additional connection pattern can be arranged in order to reduce the resistance of the connection pattern for connecting the Y-touch electrodes (Y-TE) in the above structure.

Referring to FIG. 24, the width of an end portion of the wing (WING) of each of the X-touch electrode (X-TE) and the Y-touch electrode (Y-TE) can be greater than the width of the remaining portion thereof.

In addition, the Y-touch electrodes (Y-TE), which are adjacent to each other in the first direction, can be connected to each other by a plurality of first connection patterns {i.e., Y-touch-electrode-connecting lines (Y-CL)} arranged in a layer different from the Y-touch electrodes (Y-TE).

Further, a plurality of second connection patterns for connecting the wings (WING), connected to the body (BODY) of the Y-touch electrode (Y-TE), to each other {i.e., Y-touch electrode connecting patterns (Y-CP)} can be arranged.

In this case, the plurality of Y-touch electrode connecting patterns (Y-CP) can be arranged so as to intersect the wings (WING) of the X-touch electrode (X-TE) at the narrow portions of the wings (WING).

That is, the Y-touch electrode connecting pattern (Y-CP) can be arranged so as to minimize the area where the Y-touch electrode connecting pattern (Y-CP) overlaps the X-touch electrode (X-TE), and can reduce the resistance of the Y-touch-electrode-connecting line (Y-CL) for connecting the Y-touch electrodes (Y-TE) to each other.

Figure 25:
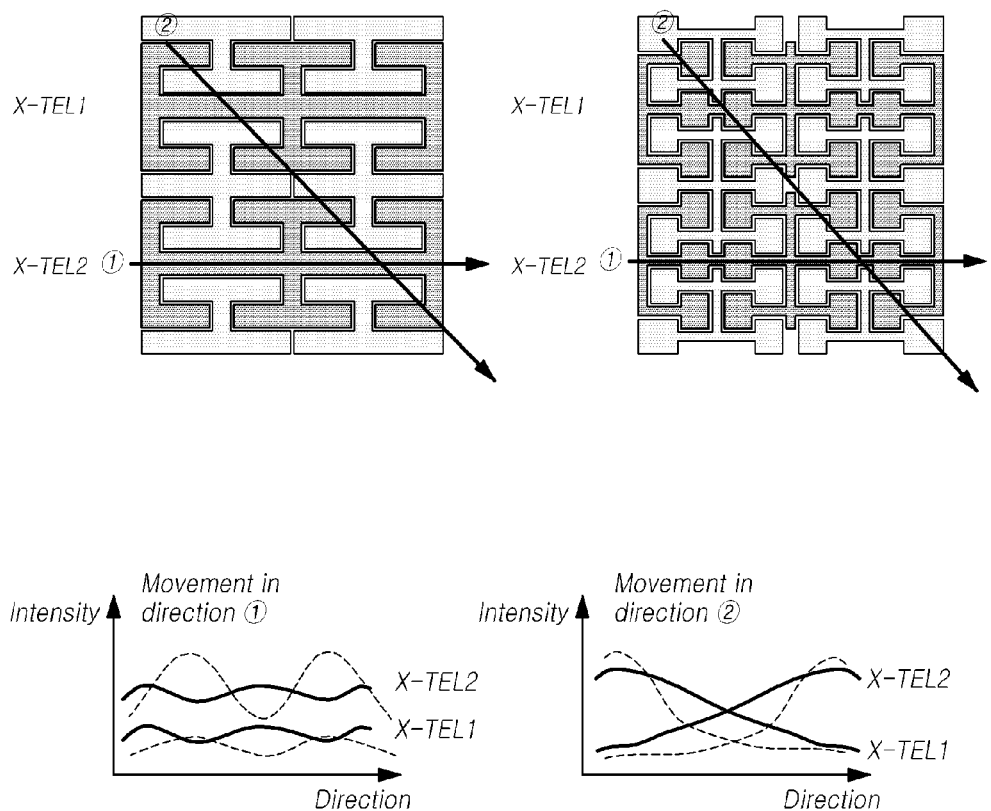
FIG. 25 is a view illustrating another example of a difference in sensing performance depending on a movement direction in a touch display device according to embodiments of the present disclosure.

FIG. 25 is a view illustrating another example of a difference in sensing performance depending on a movement direction in a touch display device 100 according to embodiments of the present disclosure.

FIG. 25 shows the sensing sensitivity depending on a movement direction of a finger or a pen in the case where the X-touch electrodes (X-TE) and the Y-touch electrodes (Y-TE) including the body (BODY) and the wings (WING) are arranged so as to interlock with each other as described above, wherein the X-touch electrode line (X-TEL) serves as a sensing touch electrode line.

If a finger/pen moves in the direction ①, the finger/pen passes through the area of the wings (WING) of the second X-touch electrode line (X-TEL2). Thus, a uniform signal above a specific level can be sensed in the second X-touch electrode line (X-TEL2).

In addition, since the wings (WING) of the first X-touch electrode line (X-TEL1) are located adjacent to the second X-touch electrode line (X-TEL2), a uniform signal having a small difference from the signal sensed in the second X-touch electrode line (X-TEL2) can be sensed in the first X-touch electrode line (X-TEL1).

If the finger/pen moves in the direction ②, the finger/pen alternately passes through the bodies (BODY) and wings (WING) of the X-touch electrodes (X-TE) and the bodies (BODY) and wings (WING) of the Y-touch electrodes (Y-TE).

Accordingly, the signal sensed in the first X-touch electrode line (X-TEL1) gradually decreases, whereas the signal sensed in the second X-touch electrode line (X-TEL2) gradually increases.

Therefore, the uniformity of sensing depending on the position or movement direction of the finger/pen can be improved.

Figure 26:
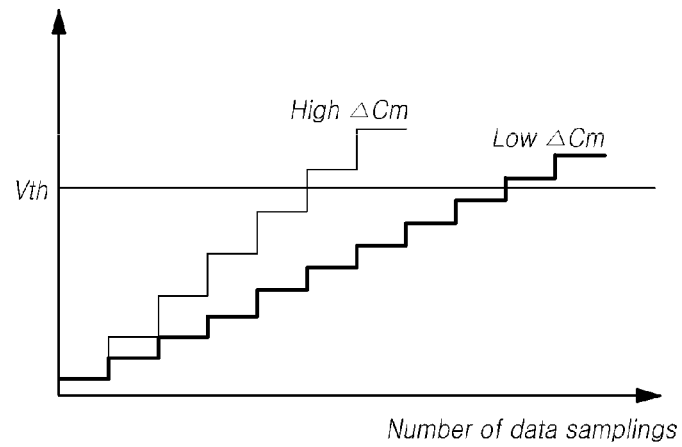
FIG. 26 is a view illustrating an effect of improving the touch-sensing performance in a touch display device according to embodiments of the present disclosure.

FIG. 26 is a view illustrating an effect of improving the touch-sensing performance in a touch display device 100 according to embodiments of the present disclosure.

Referring to FIG. 26, the amount of change in the capacitance detected through the touch-sensing signal can be increased as the boundary area between the X-touch electrode (X-TE) and the Y-touch electrode (Y-TE) increases due to the structure in which the X-touch electrode (X-TE) and the Y-touch electrode (Y-TE) have a body (BODY) and wings (WING), which are alternately arranged.

Therefore, the number of pieces of sensing data required to reach Vth, which is a reference value for touch recognition, can be reduced, thereby reducing the sensing period and improving the performance of touch sensing.

According to the above described embodiments of the present disclosure, the X-touch electrodes (X-TE) and the Y-touch electrodes (Y-TE), including a body (BODY) arranged in the first direction and one or more wings (WING) arranged in the second direction and connected to the body (BODY), can be arranged so as to interlock with each other, so that the distance between respective X-touch electrodes (X-TE) and the distance between respective Y-touch electrodes (Y-TE) can be reduced, thereby obtaining uniform sensing sensitivity depending on position.

In addition, the bodies (BODY) of the X-touch electrodes (X-TE) and the bodies (BODY) of the Y-touch electrodes (Y-TE) can be alternately arranged, and the wings (WING) of the X-touch electrodes (X-TE) and the wings (WING) of the Y-touch electrodes (Y-TE) can be alternately arranged, thereby reducing the difference in sensing sensitivity depending on the movement of the finger/pen.

In addition, the wings (WING) connected to the body (BODY) of the touch electrode (TE) can be arranged such that one of the length and the width thereof is not constant, thereby increasing the boundary area between the X-touch electrode (X-TE) and the Y-touch electrode (Y-TE) and increasing the intensity of the sensing signal.

Further, the sensing time can be reduced due to an increase in the intensity of the sensing signal, and the performance of touch sensing can be improved.

The panel can include one or more dams disposed in a non-active area of the panel and disposed between a touch pad among a plurality of touch pads and an active area of the panel, the one or more dams can be formed higher than the touch pad, and a touch routing line among the plurality of touch routing lines can descend along the inclined surface of the encapsulation layer, cross over the one or more dams, and be electrically connected to the touch pad.

Although embodiments of the present disclosure has been described for illustrative purposes, those skilled in the art will appreciate that various modifications, additions and substitutions are possible, without departing from the scope and spirit of the disclosure as disclosed in the accompanying claims. Therefore, exemplary embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

What is claimed is:

1. A touch display device comprising:
   a panel comprising a plurality of subpixels, a plurality of first touch electrodes, a plurality of second touch electrodes arranged thereon, and an encapsulation layer arranged on the plurality of subpixels, wherein the plurality of first touch electrodes and the plurality of second touch electrodes are arranged in the same layer on the encapsulation layer;
   a plurality of touch routing lines connected to the plurality of first touch electrodes and the plurality of second touch electrodes, disposed along an inclined surface of the encapsulation layer, and electrically connected to a plurality of touch pads disposed in a non-active area of the panel; and
   a touch-driving circuit configured to drive the plurality of first touch electrodes and the plurality of second touch electrodes,
   wherein each of the plurality of first touch electrodes comprises a first body arranged in a first direction, and a plurality of first wings arranged in a second direction intersecting the first direction, and connected to the first body,
   wherein each of the plurality of second touch electrodes comprises a second body arranged in the first direction, and a plurality of second wings arranged in the second direction and connected to the second body,
   wherein two first touch electrodes arranged adjacent to each other, among the plurality of first touch electrodes, are directly connected to each other,
   wherein two second touch electrodes arranged adjacent to each other, among the plurality of second touch electrodes, are electrically connected to each other by at least one first connection pattern arranged in a layer different from the second touch electrodes, and
   wherein the first body and the second body are alternately arranged in the second direction, and the plurality of first wings and the plurality of second wings are alternately arranged in the first direction.

2. The touch display device of claim 1, wherein the two first touch electrodes are arranged adjacent to each other in the second direction and are directly connected by any one of the plurality of first wings, and
   wherein the two second touch electrodes are arranged adjacent to each other in the first direction and are electrically connected by the at least one first connection pattern.

3. The touch display device of claim 2, wherein a length of a first wing among the plurality of first wings of a first touch electrode among the two first touch electrodes and arranged between the two adjacent second touch electrodes in the first direction is greater than a length of a first wing among the plurality of first wings of the first touch electrode and arranged between adjacent second wings of one of the two adjacent second touch electrodes.

4. The touch display device of claim 1, wherein a length of a second wing among the plurality of second wings of a second touch electrode and arranged between the two adjacent first touch electrodes is greater than a length of a second wing among the plurality of second wings of the second touch electrode and arranged between the plurality of first wings of one of the two adjacent first touch electrodes.

5. The touch display device of claim 1, wherein a width of an end portion of a first wing of a first touch electrode among the plurality of first touch electrode is wider than a width of another portion of the first wing, and
   wherein a width of an end portion of a second wing of a second touch electrode among the plurality of second touch electrodes is wider than a width of another portion of the second wing.

6. The touch display device of claim 5, wherein the wider portion of the first wing and the wider portion of the second wing are arranged in a zigzag arrangement.

7. The touch display device of claim 1, wherein the first body protrudes outwards from a first wing arranged at the outermost position among the plurality of first wings of a first touch electrode among the plurality of first touch electrodes, and
   wherein the second body protrudes outwards from a second wing arranged at the outermost position among the plurality of second wings of a second touch electrode among the plurality of second touch electrodes.

8. The touch display device of claim 1, wherein at least some of the plurality of second wings of a second touch electrode among the plurality of second touch electrodes are electrically connected to each other by at least one second connection pattern arranged in a layer different from the second touch electrode.

9. The touch display device of claim 1, wherein the two first touch electrodes arranged adjacent to each other, among the plurality of first touch electrodes, are directly connected to each other in the first direction by the first bodies of the two first touch electrodes, and
   wherein the two second touch electrodes arranged adjacent to each other, among the plurality of second touch electrodes, are electrically connected to each other in the second direction.

10. The touch display device of claim 1, wherein the panel further comprises one or more dams disposed in the non-active area and disposed between a touch pad among the plurality of touch pads and an active area,
    wherein the one or more dams are formed higher than the touch pad, and
    wherein a touch routing line among the plurality of touch routing lines descends along the inclined surface of the encapsulation layer, crosses over the one of more dams, and is electrically connected to the touch pad.

11. The touch display device of claim 1, wherein the plurality of first wings and the plurality of second wings are interdigitated in the first direction.

12. The touch display device of claim 1, wherein at least one of the plurality of first touch electrodes and the plurality of second touch electrodes have a "T" shape.

13. The touch display device of claim 1, wherein at least one of the plurality of first touch electrodes and the plurality of second touch electrodes are a mesh type including open areas, and the open areas positionally correspond to light emitting regions of the plurality of subpixels.

14. The touch display device of claim 1, further comprising a touch buffer film disposed between the encapsulation layer and at least one first connection pattern.

15. The touch display device of claim 1, wherein a first signal sensed from a pen by the plurality of first touch electrodes and a second signal sensed from the pen by the plurality of second touch electrodes that are adjacent to the plurality of first touch electrodes are uniform.

16. The touch display device of claim 15, wherein the first signal of the plurality of first touch electrodes and the second signal of plurality of second touch electrodes provide information of an inclination or a movement direction of the pen.

* * * * *